US011348794B2

(12) United States Patent
Nakamura et al.

(10) Patent No.: US 11,348,794 B2
(45) Date of Patent: May 31, 2022

(54) SEMICONDUCTOR FILM FORMING METHOD USING HYDRAZINE-BASED COMPOUND GAS

(71) Applicant: Tokyo Electron Limited, Tokyo (JP)

(72) Inventors: Hideo Nakamura, Yamanashi (JP);
Yosuke Serizawa, Yamanashi (JP);
Yoshikazu Ideno, Yamanashi (JP);
Hiroaki Ashizawa, Yamanashi (JP);
Takaya Shimizu, Yamanashi (JP);
Seishi Murakami, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/433,325

(22) Filed: Jun. 6, 2019

(65) Prior Publication Data
US 2019/0378723 A1   Dec. 12, 2019

(30) Foreign Application Priority Data
Jun. 8, 2018   (JP) .............................. JP2018-110713

(51) Int. Cl.
*C23C 16/34*      (2006.01)
*H01L 21/28*     (2006.01)
*C23C 16/455*    (2006.01)

(52) U.S. Cl.
CPC ........ *H01L 21/28202* (2013.01); *C23C 16/34* (2013.01); *C23C 16/45525* (2013.01)

(58) Field of Classification Search
CPC ........................... C23C 16/34; C23C 16/45525
See application file for complete search history.

(56) References Cited

U.S. PATENT DOCUMENTS

| 7,776,733 B2* | 8/2010 | Hasegawa ............... C23C 16/34 |
| | | 438/597 |
| 9,214,333 B1* | 12/2015 | Sims ................... H01L 21/0217 |
| 9,601,693 B1* | 3/2017 | Henri .................. H01L 45/1293 |
| 9,875,889 B2* | 1/2018 | Thompson ........ C23C 16/45553 |

(Continued)

FOREIGN PATENT DOCUMENTS

| CN | 102365386 A | 2/2012 |
| EP | 0005491 A1 * | 5/1979 ............. C23C 11/08 |

(Continued)

OTHER PUBLICATIONS

Alvarez, Dan, Jr., et al., "Enabling Low Temperature Metal Nitride ALD using Ultra-High Purity Hydrazine". IEEE, ET/ID: Enabling technologies and innovative devices, 2017 28th Annual SEMI Advanced Semiconductor Manufacturing Conference (ASMC), 2017, pp. 426-430.*

Burton, B.B., et al., "Tantalum Nitride Atomic Layer Deposition Using (tert-Butylimido)tris(diethylamido)tantalum and Hydrazine". J. Electrochem. Soc. 155 (7) D508-D516 (2008).*

(Continued)

*Primary Examiner* — Bret P Chen
(74) *Attorney, Agent, or Firm* — Abelman, Frayne & Schwab

(57) ABSTRACT

A film forming method includes: repeatedly performing a source gas adsorption process including supplying a source gas containing a metal element to form a nitride film on a substrate in a chamber and purging a residual gas, and a nitriding process including supplying a nitriding gas onto the substrate and purging a residual gas; and supplying a hydrazine-based compound gas as a part or all of the nitriding gas.

15 Claims, 17 Drawing Sheets

(56) References Cited

U.S. PATENT DOCUMENTS

| | | | | |
|---|---|---|---|---|
| 9,972,501 | B1* | 5/2018 | Kuyel | C23C 16/403 |
| 2006/0046478 | A1* | 3/2006 | Lim | C23C 16/34 438/681 |
| 2008/0085611 | A1* | 4/2008 | Khandelwal | H01L 21/76862 438/785 |
| 2008/0173919 | A1* | 7/2008 | Kudelka | H01L 28/65 257/306 |
| 2008/0182411 | A1* | 7/2008 | Elers | C23C 16/4554 438/685 |
| 2008/0318443 | A1* | 12/2008 | Kim | C23C 16/45553 438/785 |
| 2009/0197406 | A1* | 8/2009 | Cao | C23C 16/34 438/653 |
| 2010/0075494 | A1* | 3/2010 | Chung | C23C 16/45504 438/643 |
| 2010/0151676 | A1* | 6/2010 | Ritchie | H01L 21/76846 438/660 |
| 2010/0227046 | A1* | 9/2010 | Kato | C23C 16/45551 427/10 |
| 2010/0227059 | A1* | 9/2010 | Kato | C23C 16/45551 427/255.28 |
| 2011/0311725 | A1* | 12/2011 | Sneh | C23C 16/18 427/250 |
| 2012/0108077 | A1* | 5/2012 | Kaga | H01L 21/28562 438/771 |
| 2013/0095668 | A1* | 4/2013 | Saito | C23C 16/4412 438/758 |
| 2014/0024814 | A1* | 1/2014 | Mogi | C07F 17/00 534/15 |
| 2014/0273452 | A1 | 9/2014 | Blomberg et al. | |
| 2017/0338109 | A1* | 11/2017 | Lei | H01L 21/02222 |
| 2018/0033608 | A1* | 2/2018 | Miyahara | H01L 29/4983 |
| 2018/0122642 | A1* | 5/2018 | Raisanen | H01L 21/28088 |
| 2019/0027573 | A1* | 1/2019 | Zhu | H01L 29/4966 |
| 2020/0035481 | A1* | 1/2020 | Tapily | H01L 21/0234 |

FOREIGN PATENT DOCUMENTS

| | | |
|---|---|---|
| JP | 2003-213418 A | 7/2003 |
| JP | 4178776 B | 9/2008 |
| JP | 2010-248624 A | 11/2010 |
| JP | 2011-252221 A | 12/2011 |
| JP | 2015-078418 A | 4/2015 |
| KR | 10-2011-0131220 A | 12/2011 |
| KR | 10-2017-0018343 A | 2/2017 |
| WO | WO 2007/112780 A1 * | 10/2007 ............ C23C 16/34 |

OTHER PUBLICATIONS

Shih, Huan-Yu, et al., "Low-temperature atomic layer epitaxy of AlN ultrathin films by layer-by-layer, in-situ atomic layer annealing". Scientific Reports, 7:39717, (2017) pp. 1-8. DOI: 10.1038/srep39717.*

Amato-Wierda, Camela, et al., "Chemical vapor deposition of titanium nitride thin films from tetrakis(dimethylamido)titanium and hydrazine as a coreactant". J. Mater. Res., vol. 15, No. 11, Nov. 2000, pp. 2414-2424.*

Yusup, Luchana L., et al., "Reactivity of different surface sites with silicon chlorides during atomic layer deposition of silicon nitride". RSC Adv., 2016, 6, 68515-68524.*

Jacob, K.T., et al., "Nitride synthesis using ammonia and hydrazine—a thermodynamic panorama". Journal of Materials Science 37 (2002) 4465-4472.*

Burton, B.B., et al., "Tantalum Nitride Atomic Layer Deposition Using (tertButylimido)tris(diethylamido) tantalum and Hydrazine". J. Electrochem. Soc. 155 (7) 2008, D508-D516.*

Rodgers Jr., J.W., et al., "Thermal Nitridation of Si(100) using hydrazine and ammonia". AIP Conference Proceedings 167, 133 (1988), one page. Abstract Only https://doi.org/10.1063/1.37171.*

Yoshioka, Satoshi, et al., "Deposition of Silicon Nitride Films by the Silane-Hydrazine Process". J. Electrochem. Soc.: Solid State Science, vol. 114, No. 9, Sep. 1967, pp. 962-964.*

Wolf, Steven, et al., "Low temperature thermal ALD TaNx and TiNx films from anhydrous N2H4". Applied Surface Science 462 (2018) 1029-1035.*

Golrokhi, Zahra, et al., "The influence of tertiary butyl hydrazine as a co-reactant on the atomic layer deposition of silver". Applied Surface Science 399 (2017) 123-131.*

Abdulagatov, A.I., et al., "Atomic Layer Deposition of Aluminum Nitride Using Tris(diethylamido)aluminum and Hydrazine or Ammonia". Russian Microelectronics, 2018, vol. 47, No. 2, pp. 118-130.*

Fang, Ziwen, et al., "Atomic layer deposition of TaN and Ta3N5 using pentakis(dimethylamino) tantalum and either ammonia or monomethylhydrazine". Journal of Crystal Growth 331 (2011) 33-39.*

Vos, Martijn, et al., "Atomic Layer Deposition of Cobalt Using H2, N2, and NH3 Based Plasmas: On the Role of the Co-reactant". J. Phys. Chem. C 2018, 122, 22519-22529.*

Alvarez, D., et al., "Enabling low temperature metal nitride ALD using ultra-high purity hydrazine: ET/ID: Enabling technologies and innovative devices". 2017 28th Annual SEMI Advanced Semiconductor Manufacturing Conference (ASMC), 2017, pp. 426-430.*

* cited by examiner

US 11,348,794 B2

1

SEMICONDUCTOR FILM FORMING METHOD USING HYDRAZINE-BASED COMPOUND GAS

CROSS-REFERENCE TO RELATED APPLICATIONS

This application is based on and claims priority from Japanese Patent Application No. 2018-110713, filed on Jun. 8, 2018, with the Japan Patent Office, the disclosures of which are incorporated herein in their entireties by reference.

TECHNICAL FIELD

The present disclosure relates to a film forming method and a film forming apparatus.

BACKGROUND

In the manufacturing process of semiconductor devices, various nitride films such as, for example, a TiN film and a SiN film, are used. As a method of forming such a nitride film, a chemical vapor deposition is known in which a source gas and ammonia ($NH_3$) gas serving as a nitriding gas are reacted.

In recent years, with the miniaturization of semiconductor devices, film formation at a lower temperature is required for a nitride film. As a technology capable of forming a nitride film at a lower temperature, Japanese Patent No. 4178776 proposes a film forming method in which a source gas is intermittently supplied, a nitriding gas is supplied at the same time as a metal source gas, and the nitriding gas is supplied even in an intermittent period of the metal source gas.

Meanwhile, atomic layer deposition (ALD), which alternately supplies a source gas and a reaction gas, is known as a technology for forming a film having an improved film quality at a lower temperature and with a higher step coverage. A film forming through ALD is also performed when forming a nitride film. For example, Japanese Patent Laid-Open Publication No. 2015-078418 proposes a technology for forming a TiN film through ALD using titanium tetrachloride ($TiCl_4$) as a source gas and using $NH_3$ gas as a nitriding gas.

SUMMARY

Therefore, a film forming method according to an embodiment of the present disclosure includes: repeatedly performing a source gas adsorption process including supplying a source gas containing a metal element to form a nitride film on a substrate in a chamber and purging a residual gas, and a nitriding process including supplying a nitriding gas onto the substrate and purging a residual gas; and supplying a hydrazine-based compound gas as a part or all of the nitriding gas.

The foregoing summary is illustrative only and is not intended to be in any way limiting. In addition to the illustrative aspects, embodiments, and features described above, further aspects, embodiments, and features will become apparent by reference to the drawings and the following detailed description.

2

Figure 2:
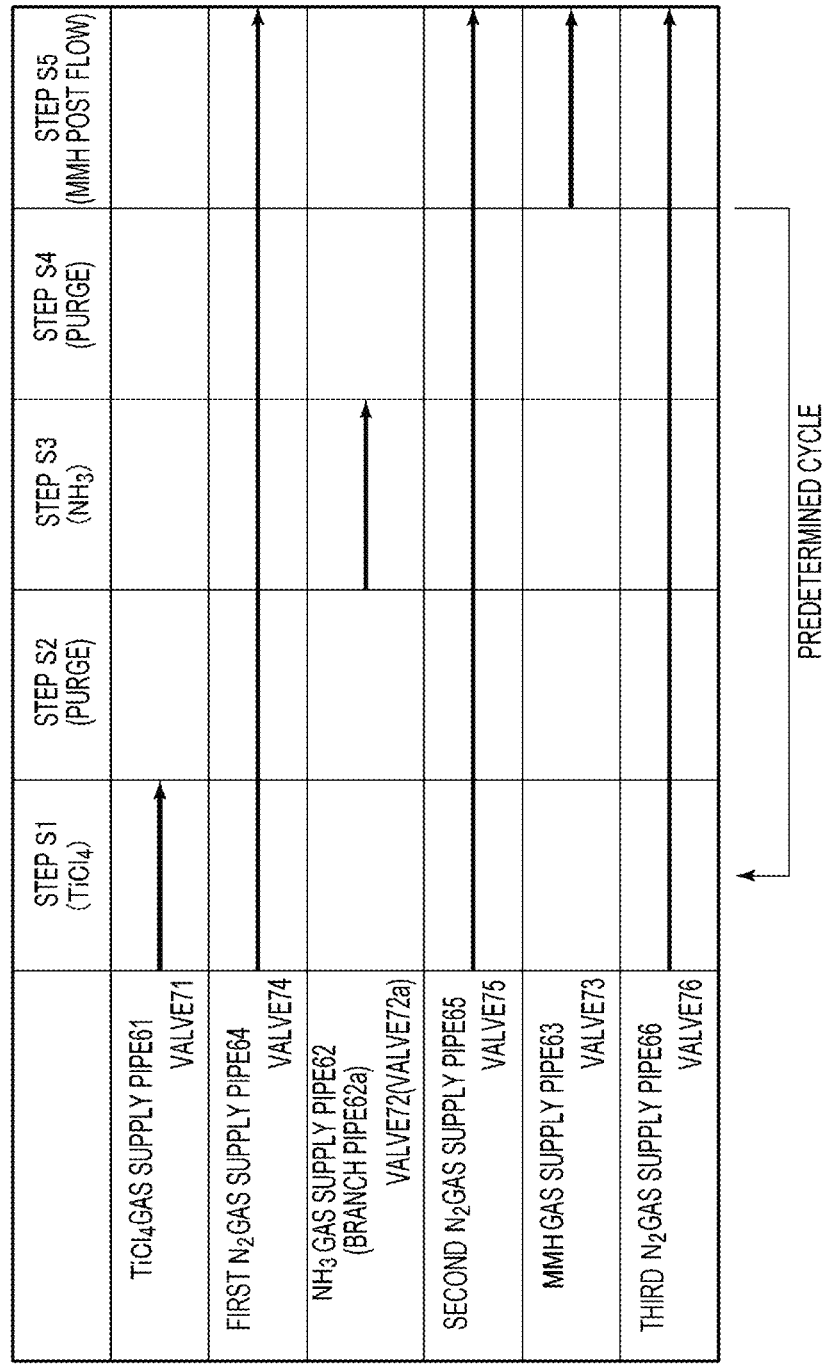

FIG. 2 is a diagram illustrating a gas supply sequence of case A.

Figure 3:
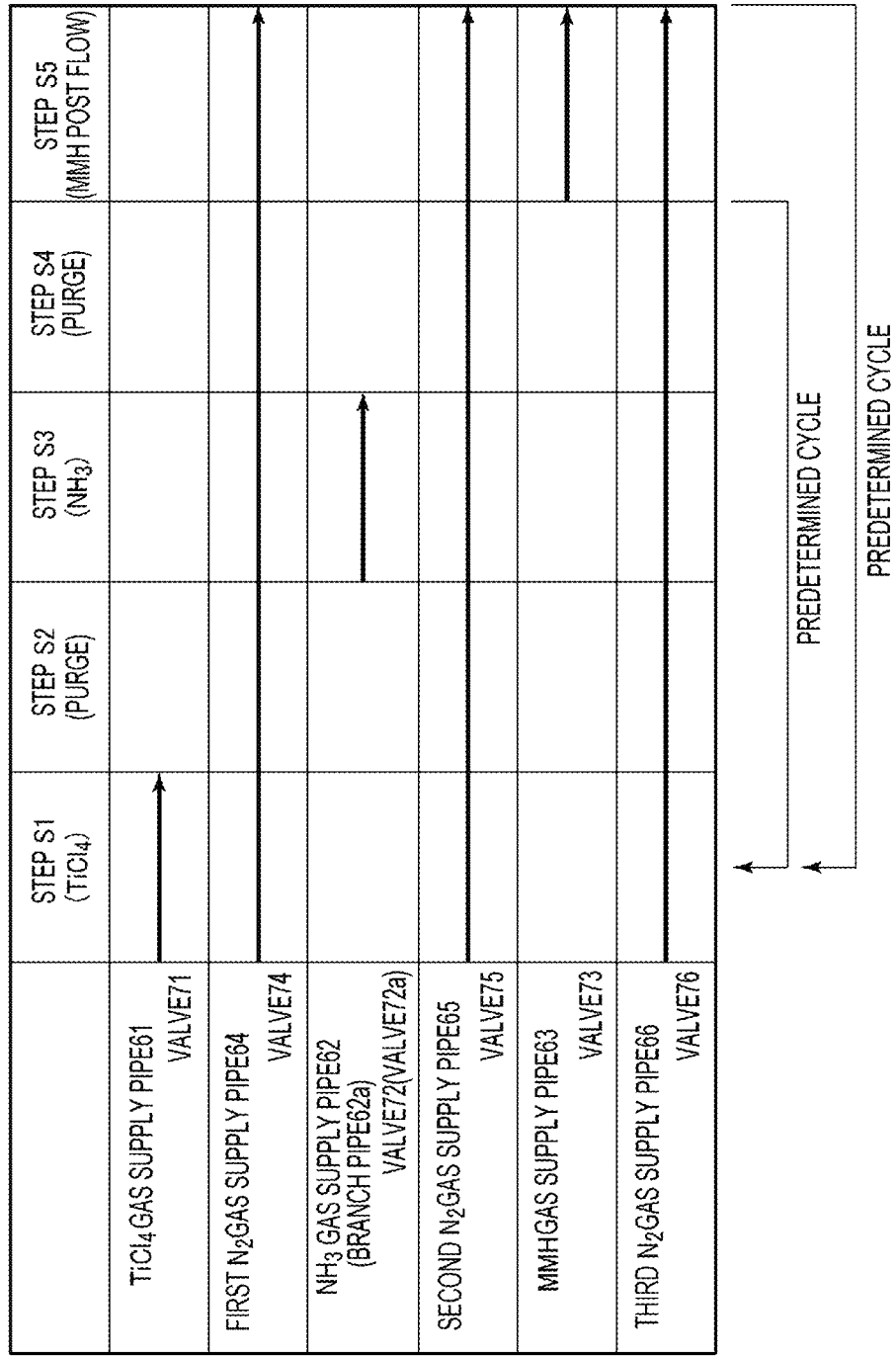

FIG. 3 is a diagram illustrating a gas supply sequence of case B.

Figure 4:
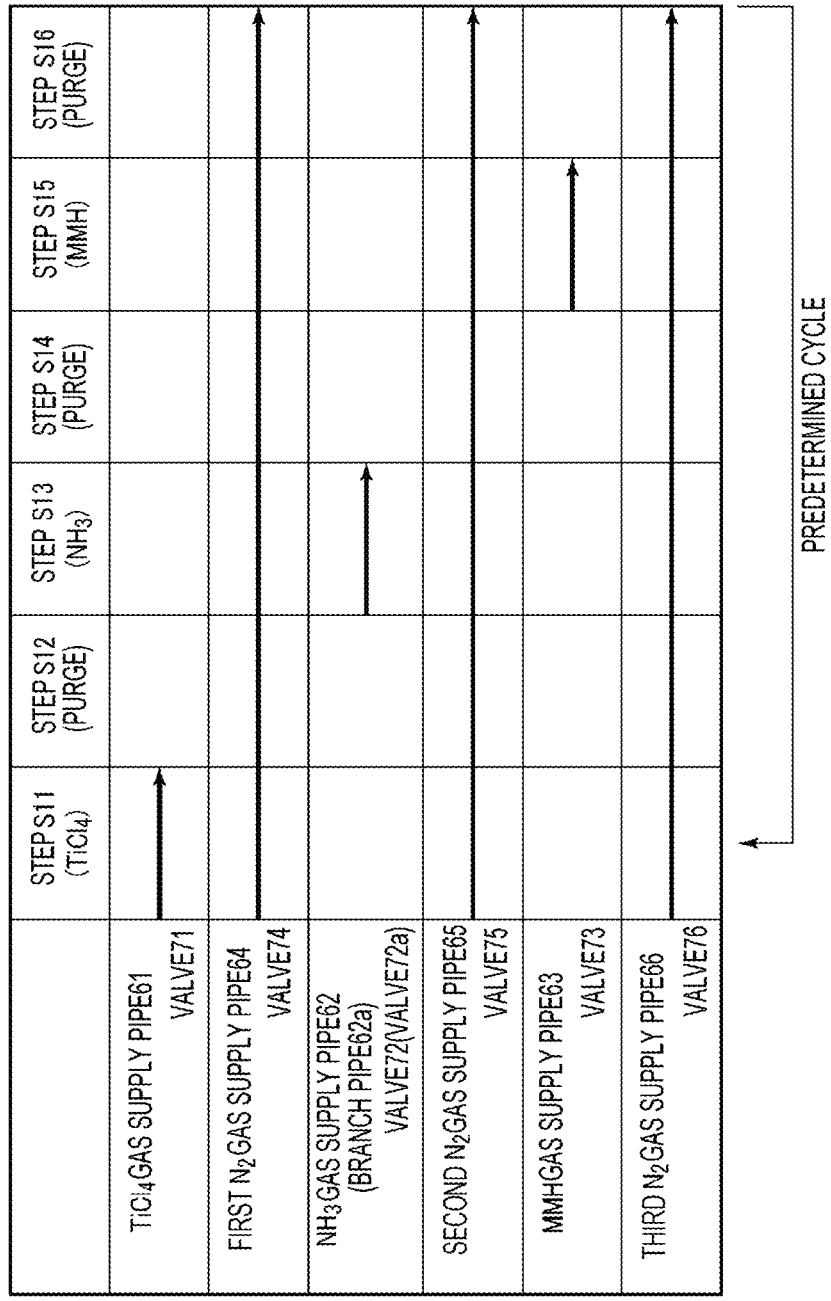

FIG. 4 is a diagram illustrating a gas supply sequence of case C.

Figure 5:
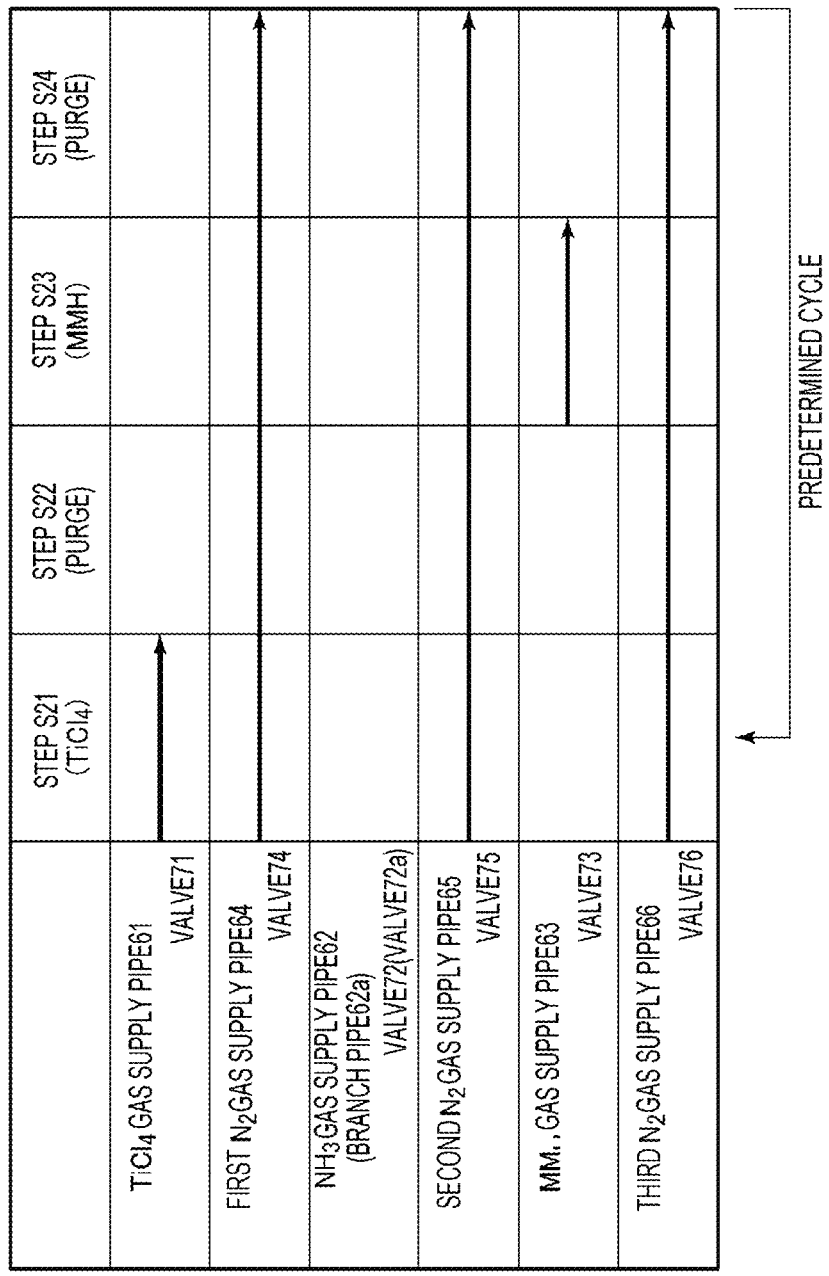

FIG. 5 is a diagram illustrating a gas supply sequence of case D.

Figure 6:
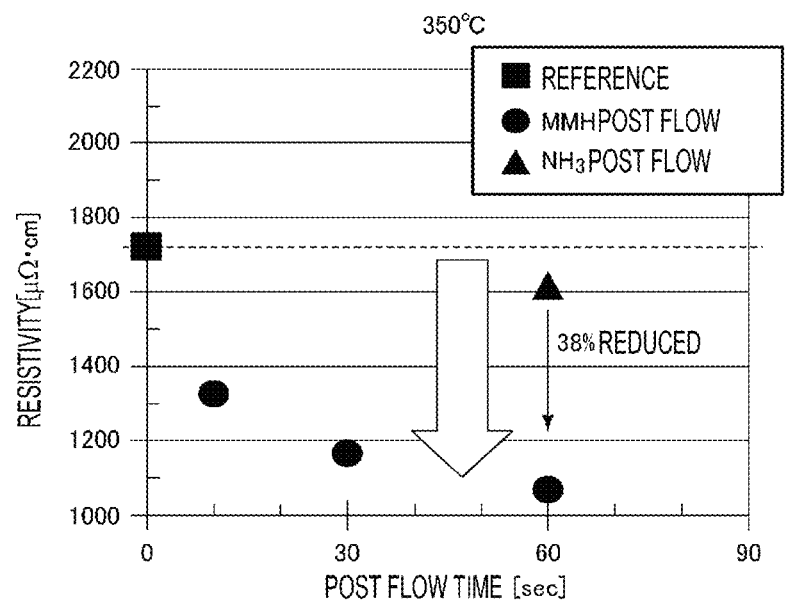

FIG. 6 is a diagram illustrating the influence of a post flow on a film resistivity when a film forming temperature is 350° C.

Figure 7:
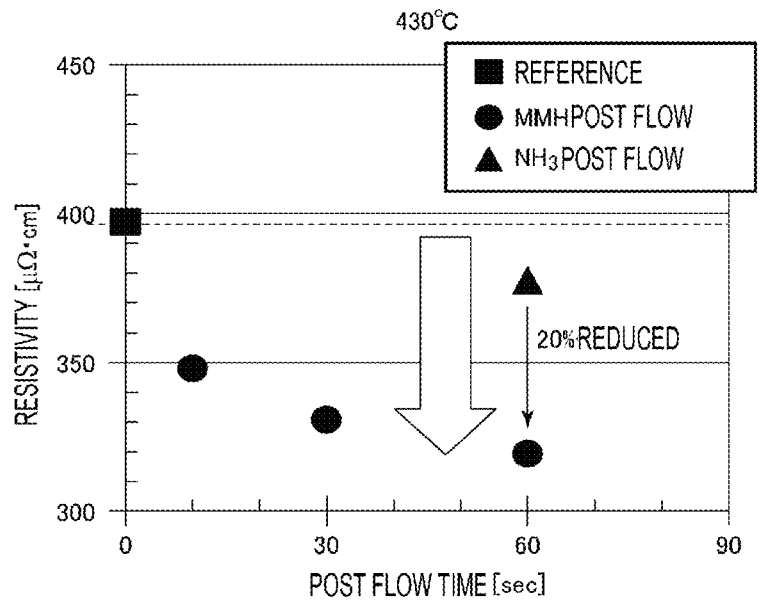

FIG. 7 is a diagram illustrating the influence of a post flow on a film resistivity when a film forming temperature is 430° C.

Figure 8:
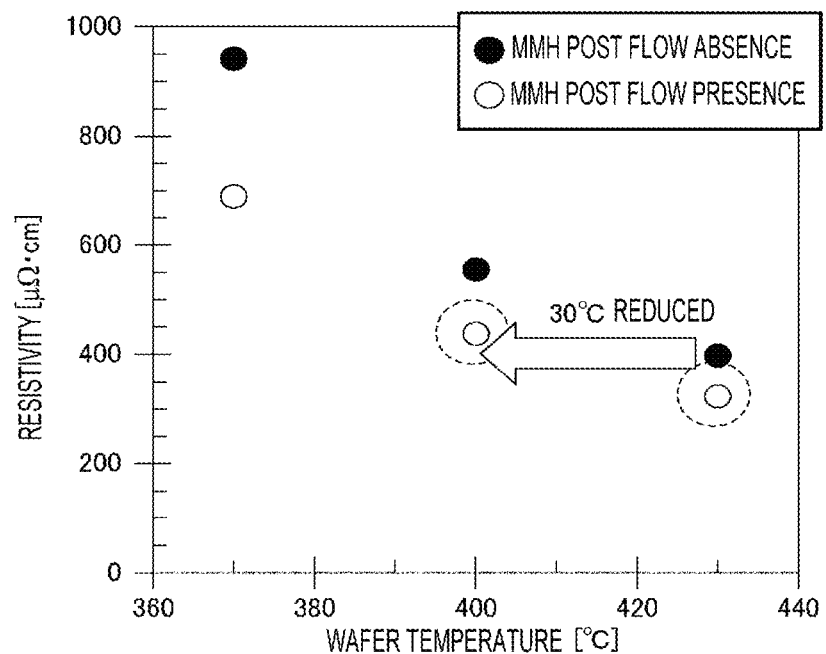

FIG. 8 is a diagram illustrating a relationship between a wafer temperature and a film resistivity in each of the case where there is no post flow and the case where the post flow time of an MMH gas is 60 sec.

Figure 9:
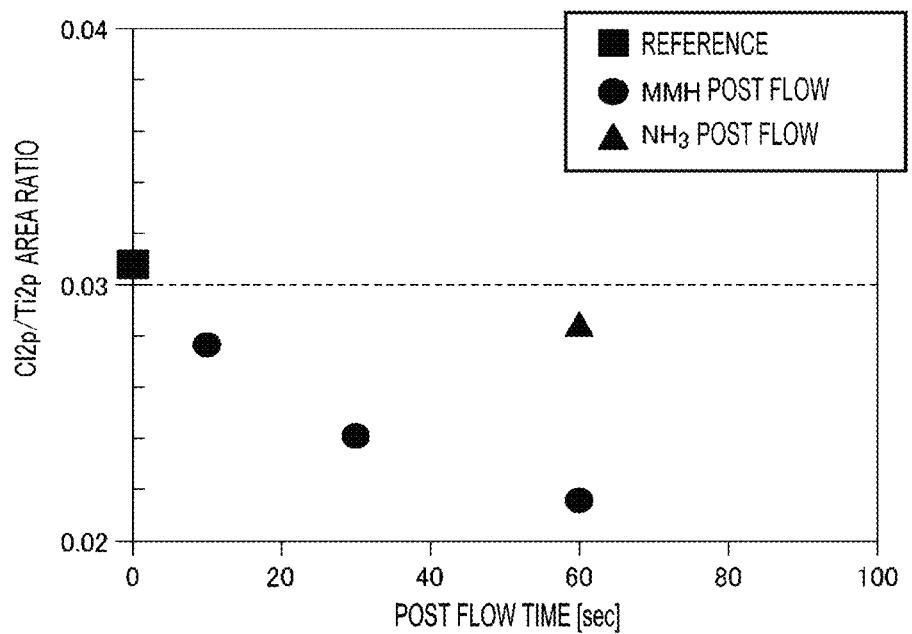

FIG. 9 is a diagram representing a relationship between a post flow time and a Cl2p/Ti2p area ratio by XPS, which is an index of a Cl concentration in a film.

Figure 10:
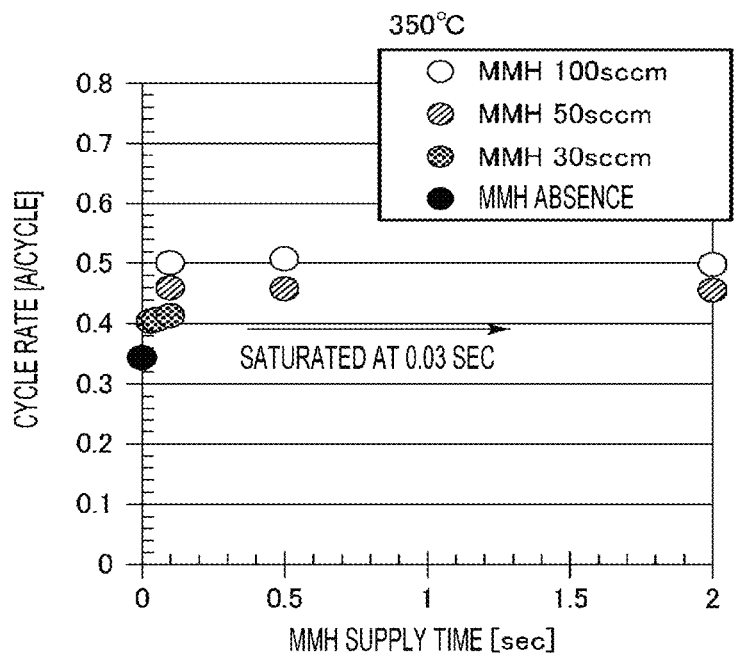

FIG. 10 is a diagram representing a relationship between an MMH gas supply time and a cycle rate at each flow rate when a TiN film was formed at the wafer temperature of 350° C. while changing the flow rate and the supply time of the MMH gas in step S15.

Figure 11:
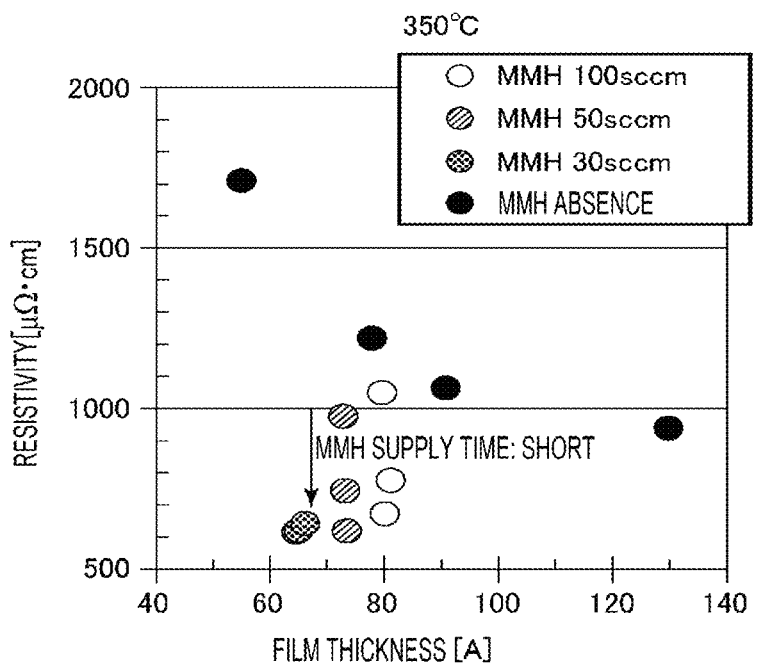

FIG. 11 is a diagram representing a relationship between a film thickness and a resistivity of a TiN film when the TiN film was formed at the wafer temperature of 350° C. while changing the flow rate and the supply time of the MMH gas in step S15.

Figure 12:
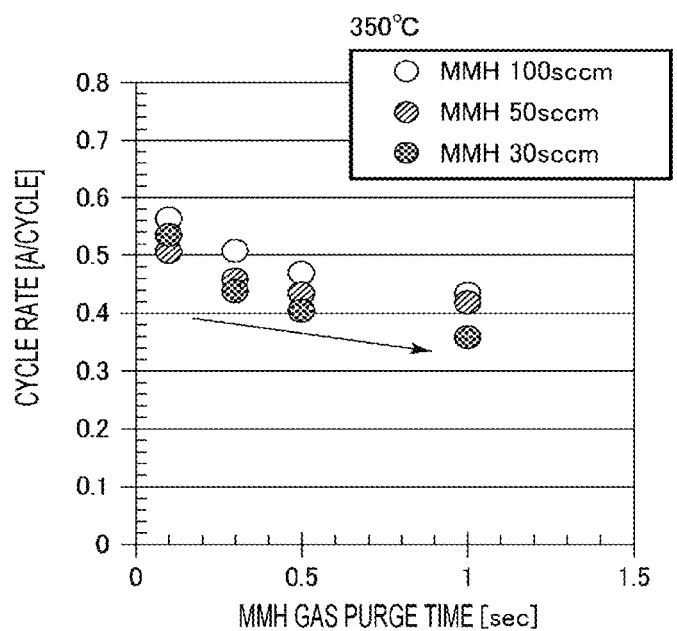

FIG. 12 is a diagram representing a relationship between an MMH gas supply time and a cycle rate at each flow rate when a TiN film was formed at the wafer temperature of 350° C. while changing the flow rate and the purge time of the MMH gas in step S16.

Figure 13:
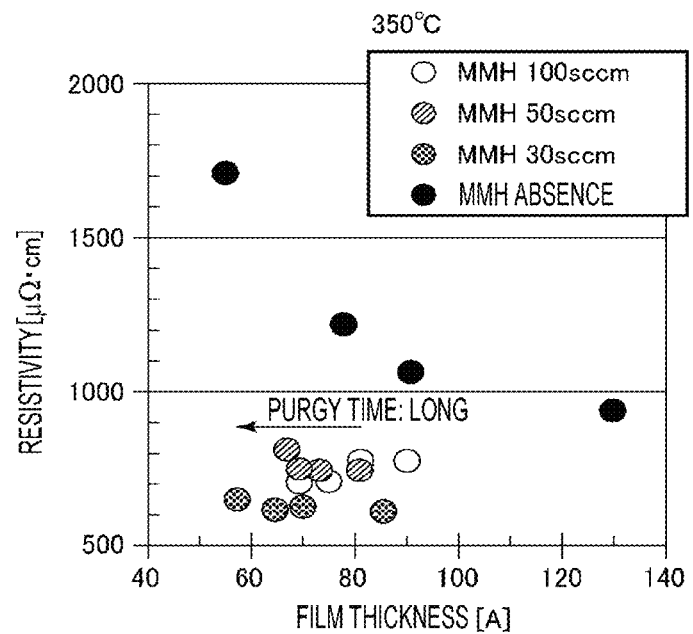

FIG. 13 is a diagram representing a relationship between a film thickness and a resistivity of a TiN film when the TiN film was formed at the wafer temperature of 350° C. while changing the flow rate and the purge time of the MMH gas in step S16.

Figure 14:
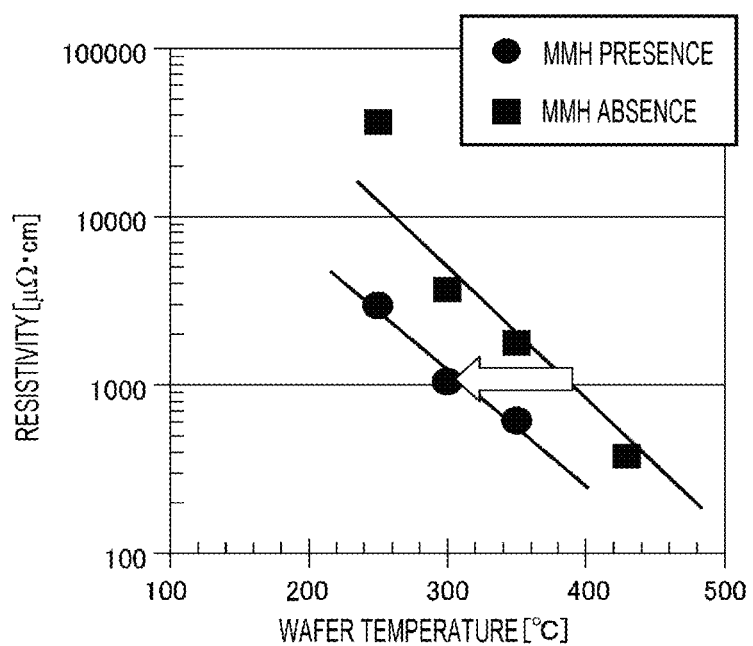

FIG. 14 is a diagram representing a relationship between a film formation temperature and a resistivity of a film obtained in each of the case of MMH gas presence and the case of MMH gas absence.

Figure 15:
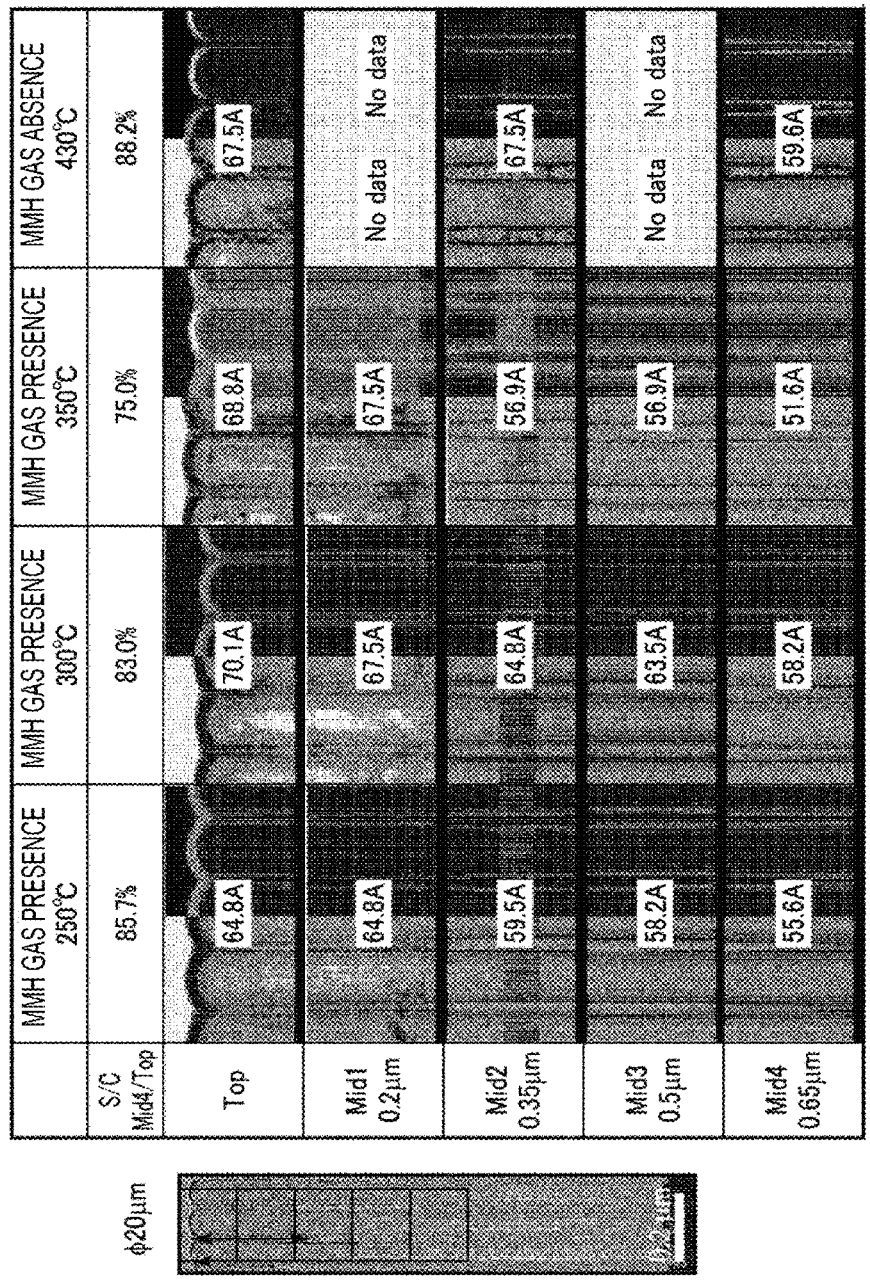

FIG. 15 illustrates cross-sectional TEM photographs obtained in the cases where TiN films are buried in holes through film formation under the reference conditions of Case C in the presence of an MMH gas and at the wafer temperatures of 250° C., 300° C., and 350° C., and in the case where a TiN is buried in a hole at the wafer temperature of 430° C. in the absence of an MMH gas.

Figure 16:
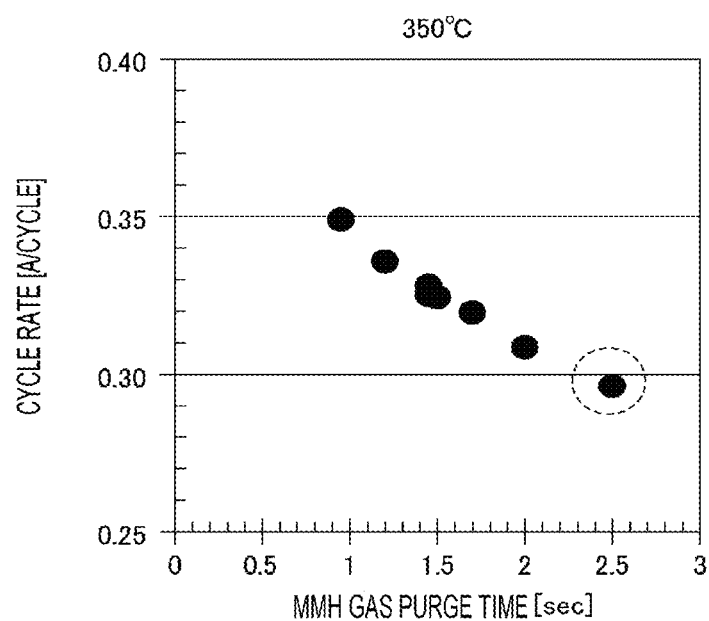

FIG. 16 is a diagram representing a relationship between a purge time and a cycle rate when a TiN film was formed at a wafer temperature of 350° C. while changing the purge time after supplying the MMH gas in step S16 between 1 and 2.5 sec.

Figure 17:
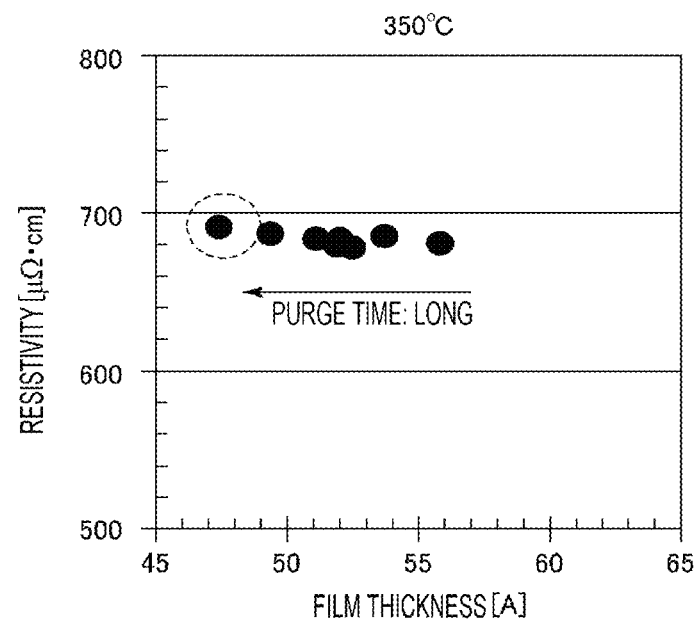

FIG. 17 is a diagram representing a relationship between a film thickness and a resistivity of a TiN film when a TiN film was formed at a wafer temperature of 350° C. while changing the purge time after supplying the MMH gas in step S16 between 1 and 2.5 sec.

Figure 18:
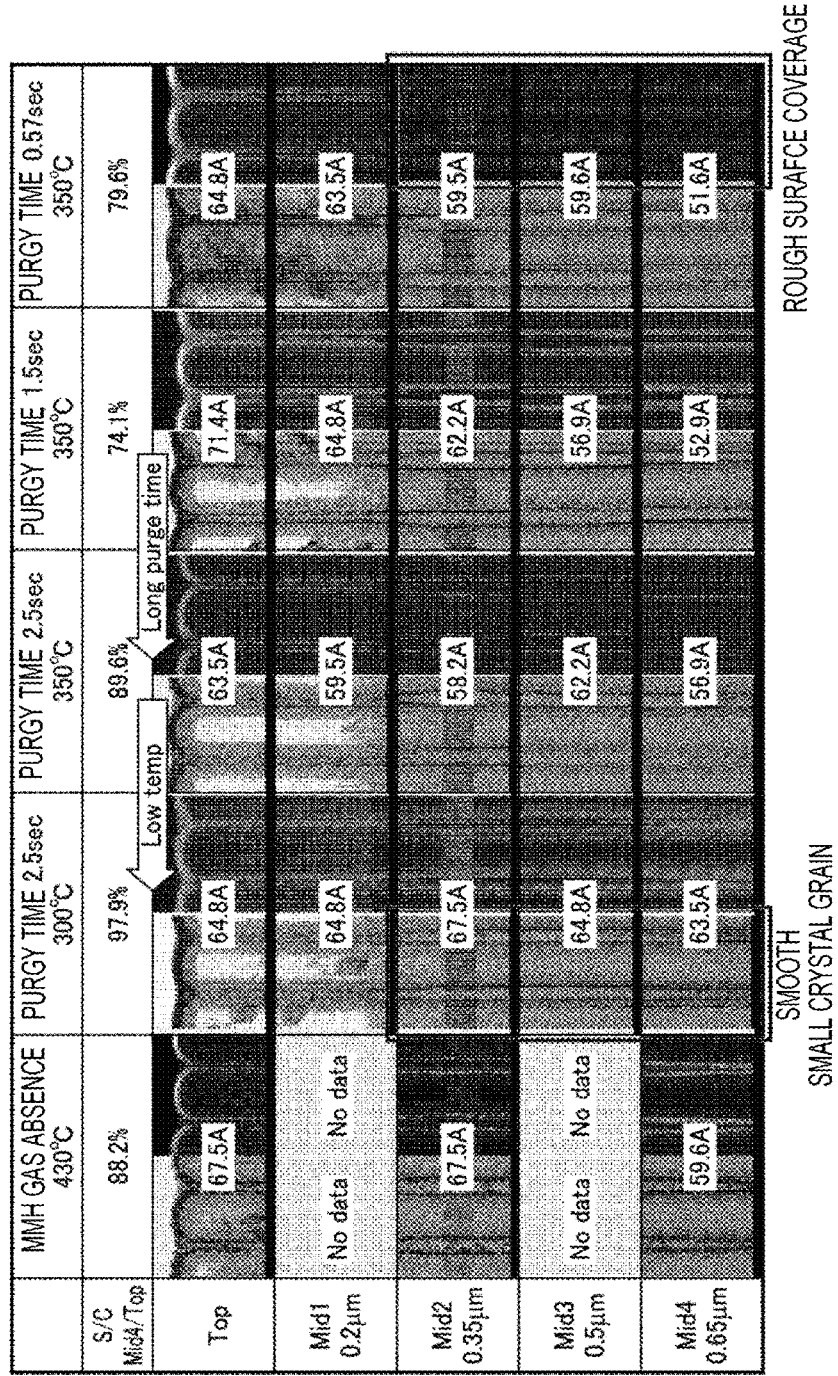

FIG. 18 illustrates cross-sectional TEM photographs obtained in the cases where TiN films were formed while changing the MMH gas purge time and the wafer temperature in step 16 among the reference conditions of Case C in the presence of an MMH gas.

Figure 19:
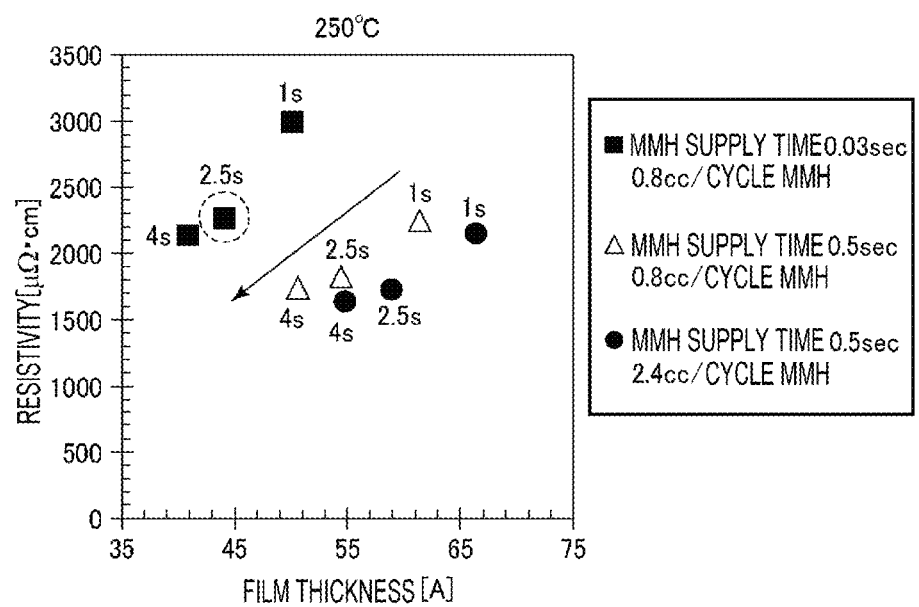

FIG. 19 is a diagram representing a relationship between a film thickness and a resistivity of a TiN film when a TiN film was formed at a wafer temperature of 250° C. while changing the MMH gas purge time in step S16 between 1 sec and 4 sec and changing an MMS gas exposure amount to 0.8 cc/cycle and 2.4 cc/cycle.

Figure 20:
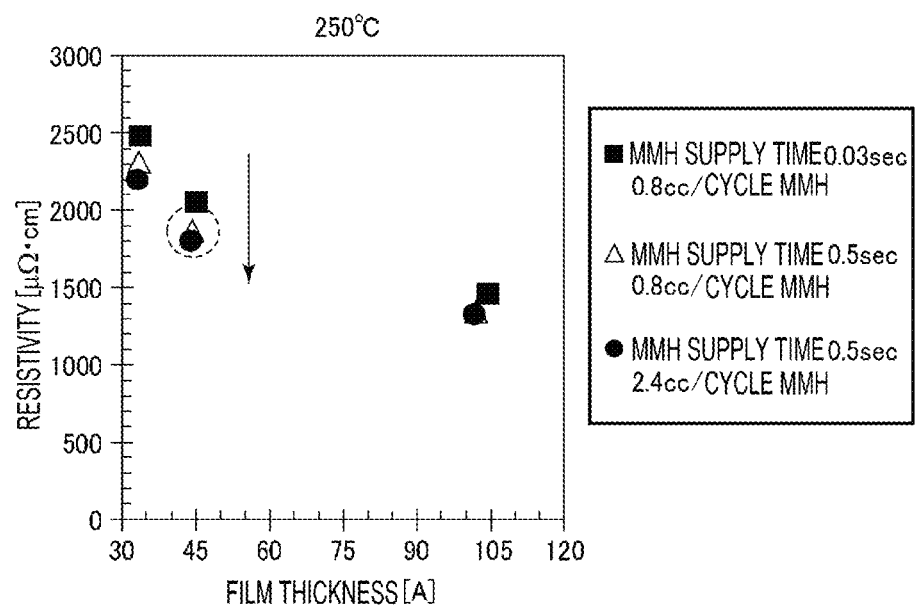

FIG. 20 is a diagram representing a relationship between a film thickness and a resistivity of a TiN film when a TiN film was formed at a wafer temperature of 250° C. in the state where the MMH gas purge time in step S16 was set to 4 sec and the MMS gas exposure amount in step S16 was changed to 0.8 cc/cycle and 2.4 cc/cycle.

Figure 21:
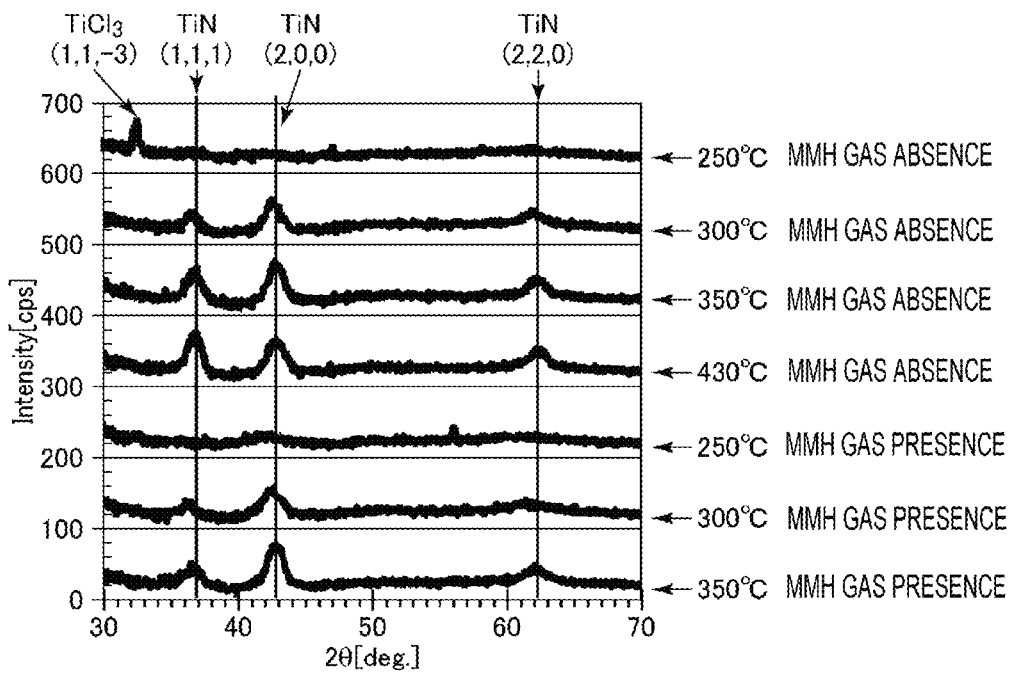

FIG. 21 is a diagram representing XRD spectrums of TiN films formed while changing the temperature under the conditions of Case C in the presence of an MMH gas and TiN films formed while changing the temperature under the conditions of Case C in the absence of an MMH gas.

Figure 22:
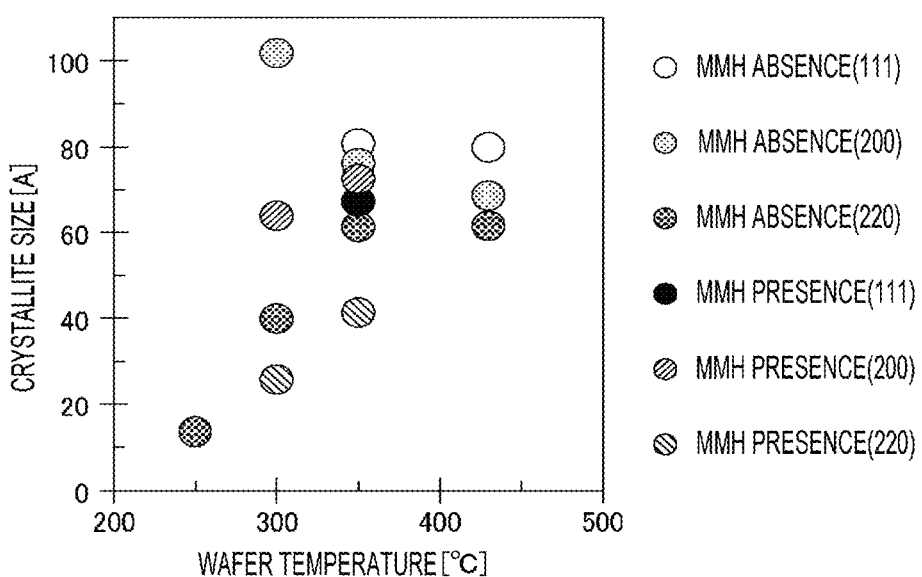

FIG. 22 is a diagram illustrating a relationship between a wafer temperature and a crystallite size obtained from a half-value width of a TiN diffraction peak of an XRD spectrum of each of TiN films formed while changing the temperature under the conditions of case C in the presence of an MMH gas and each of TiN films formed while changing temperature under the conditions of case C in the absence of an MMH gas.

Figure 23:
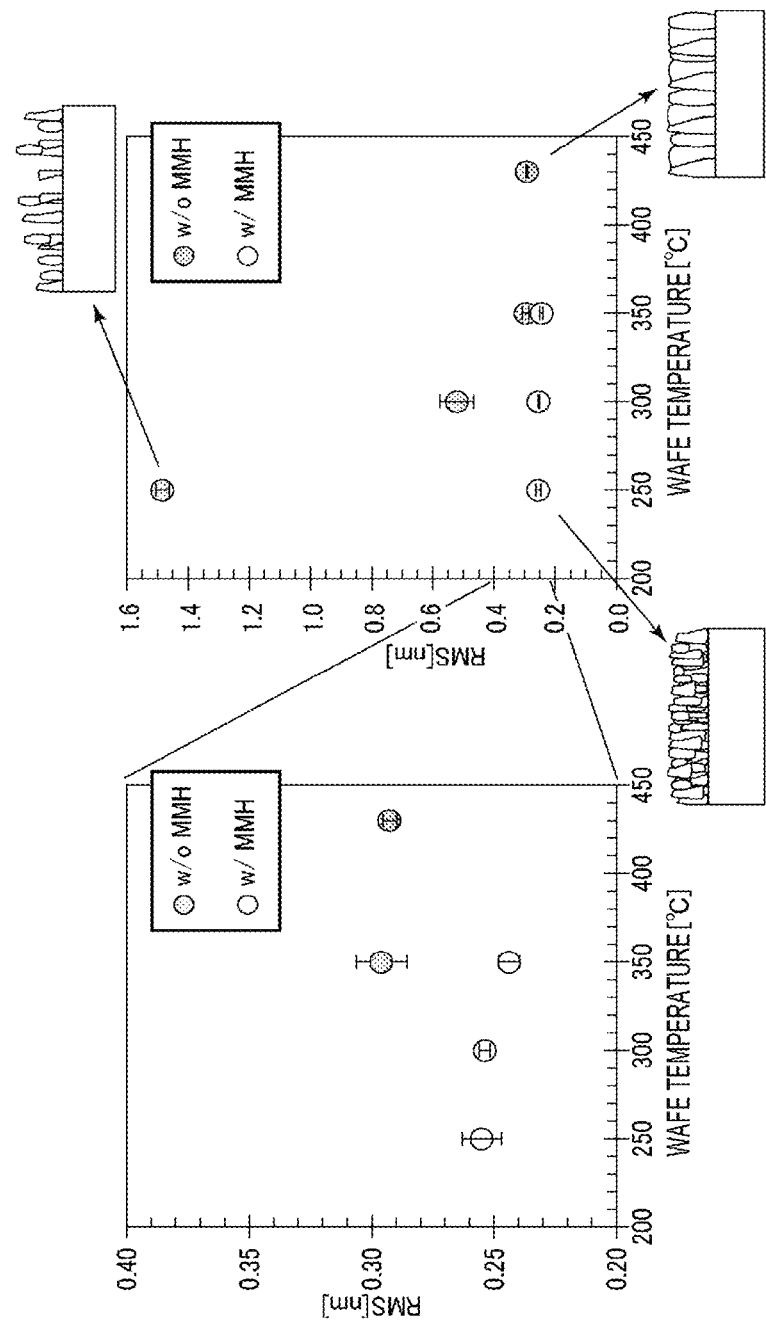

FIG. 23 is a diagram representing a relationship between a wafer temperature and a surface roughness (RMS) of each of TiN films formed while changing the temperature under the conditions of Case C in the presence of an MMH gas and each of TiN films formed while changing the temperature under the conditions of Case C in the absence of an MMH gas.

Figure 24:
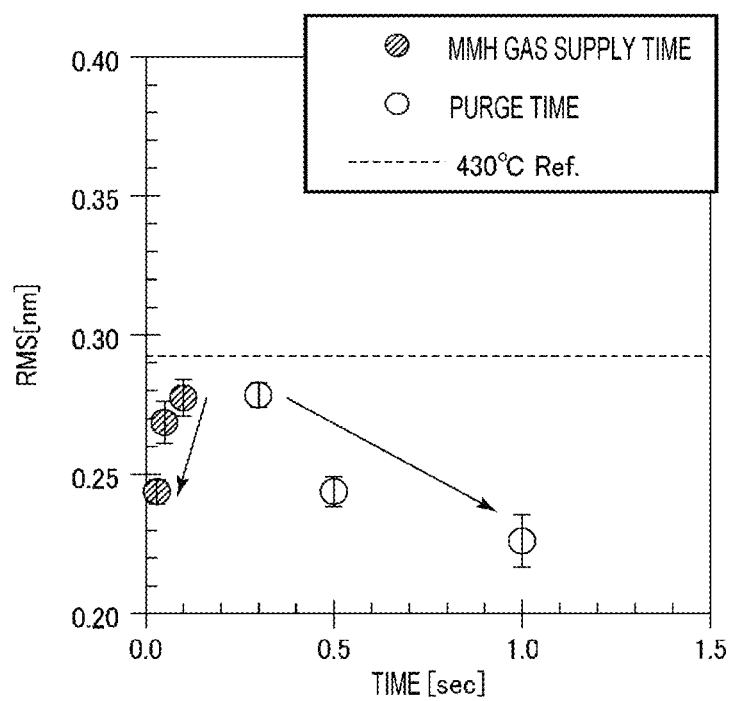

FIG. 24 is a diagram representing an MMH gas supply time, a purge time, and a value of surface roughness (RMS) in each of the case where the MMH gas supply time was changed at the film forming temperature of 350° C., and the case where the purge time after supplying the MMH gas was changed at the film forming temperature of 350° C.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, embodiments will be described with reference to the accompanying drawings.

<Background and Outline>

First, the background and outline of a film forming method of the present disclosure will be described. In the formation of a nitride film, conventionally, CVD based on the reaction of a source gas and a nitriding gas has been used. For example, in the formation of a TiN film, the film formation is performed at a relatively high temperature of about 560° C. using TiCl$_4$ gas and NH$_3$ gas.

However, with the miniaturization of semiconductor devices, a nitride film is required to be formed at a lower temperature from the viewpoint of preventing thermal damage to, for example, a film existing in the layer therebelow. However, when the film formation temperature is merely lowered, film quality is deteriorated due to the residual chlorine. For this reason, in Japanese Patent No. 4178776, the formation of a nitride is performed by intermittently supplying a raw material gas, supplying a nitriding gas simultaneously with the metal raw material gas, and supplying the nitriding gas even in the intermittent period of the metal raw material gas. As a result, it is possible to reduce residual chlorine, and thus film formation at a lower temperature is enabled.

Meanwhile, the technology of Japanese Patent No. 4178776 may realize lowering of the film forming temperature to a certain extent. However, since it is based on CVD, there is a limit to lowering the temperature from the viewpoint of maintaining a good film quality, and a step coverage in a minute portion is insufficient.

In contrast, in the film formation through ALD described in Japanese Patent Laid-Open Publication No. 2015-078418, it is possible to form a film having a good film quality at a lower temperature and with a high step coverage. Specifically, in Japanese Patent Laid-Open Publication No. 2015-078418, the temperature is lowered to 450° C. or less through ALD using TiCl$_4$ as a source gas and using NH$_3$ gas as a nitriding gas.

However, recently, further miniaturization of semiconductor devices has progressed, and a process capable of additional low temperature film formation is required, and a desired film quality may not be obtained at the required temperature through ALD using NH$_3$ gas as a nitriding gas. In addition, the time required for nitriding may be long and productivity may be reduced.

Therefore, in an embodiment of the present disclosure, in forming a nitride film on a substrate in a chamber, on the basis of ALD that repeatedly performs a source gas adsorption process including a step of supplying a source gas containing a metal element and forming the nitride film and a step of purging residual gas and a nitriding process including a step of supplying a nitriding gas onto the substrate and a step of purging residual gas, a hydrazine compound gas is supplied as part or all of the nitriding gas.

As a result, the nitriding power is further enhanced and the effect of removing impurities (e.g., chlorine) remaining in the film is capable of being made very high, so that it is possible to obtain a nitride film having a good film quality even at a lower temperature. For example, when forming a TiN film, it is possible to obtain a film having a good film quality at a low temperature of 400° C. or lower. In addition, by tuning conditions, it is possible to obtain a film having high film quality at a low temperature which cannot be considered conventionally, in the range of 200 to 300° C., for example, 250° C.

The hydrazine compound is a compound having N—N bonds represented in the following formula 1.

In the formula, R$_1$, R$_2$, R$_3$, and R$_4$ are H or monovalent hydrocarbon groups.

The hydrazine compound may be, for example, hydrazine in which R$_1$, R$_2$, R$_3$, and R$_4$ are all H, monomethyl hydrazine (MMH) in which one of R$_1$, R$_2$, R$_3$, and R$_4$ and the remaining ones are methyl groups, or dimethylhydrazine (DMH) in which two of R$_1$, R$_2$, R$_3$, and R$_4$ are methyl groups and the remaining ones are H.

As the nitride film, binary nitride films such as, for example, BN, AlN, SiN, ScN, TiN, VN, CrN, MnN, FeN, CoN, NiN, CuN, ZnN, GaN, GeN, YN, ZrN, NbN, MoN, RuN, RhN, PdN, AgN, CdN, InN, SnN, HfN, TaN, WN, ReN, IrN, HgN, TlN, and PbN, may be used. In addition to the binary type, a ternary or higher type multi-layered nitride film containing two or more types of metal elements may be used.

As the source gas, a chlorine-containing compound may be used suitably. However, without being limited thereto, a fluorine-containing compound and an organic compound may also be used. A chlorine-containing compound, a fluorine-containing compound, or an organic compound may be used as a source gas depending on various types of metals. For example, in the case of a TiN film, $TiCl_4$ or tetrakis diethylamino titanium (TDEAT) may be used, in the case of an AlN film, $AlCl_3$ or trimethylaluminum (TMA) may be used, and in the case of a WN film, $WCl_6$ or $WF_6$ may be used.

All the gases used as nitriding gases may be hydrazine compound gases, or hydrazine compound gases and $NH_3$ gas may be used in combination. In addition, the formation of a nitride film based on ALD, in which a source gas and a nitriding gas are sequentially supplied, is based on a sequence repeating the source gas adsorption process and the nitriding process, and supply of an additional nitriding gas may be performed as necessary.

The following cases 1 to 4 are exemplified as typical gas supply sequences.

Case 1

After repeating supply of a source gas→purge of residual gas→supply of $NH_3$ gas→purge of residual gas a predetermined number of times, a post flow with a hydrazine compound gas is performed.

Case 2

After repeating supply of a raw material gas→purge of residual gas→supply of $NH_3$ gas→purge of residual gas a predetermined number of times, a sequence performing a post flow with a hydrazine compound gas is repeated multiple times with purge interposed between sequences.

Case 3

Supply of a source gas→purge of residual gas→supply of $NH_3$ gas→purge of residual gas→supply of a hydrazine compound gas→purge of residual gas is repeated a predetermined number of times. In this case, supply of $NH_3$ gas→purge of residual gas→supply of a hydrazine compound gas→purge of residual gas constitutes a nitriding process.

Case 4

Supply of a source gas→purge of residual gas→supply of a hydrazine compound gas→purge of residual gas is repeated a predetermined number of times.

Purge of residual gas is a process of removing residual gas on the substrate, and in a single wafer type, batch type, or semi-batch type film forming apparatus, the exhaust of residual gas in the chamber is performed by evacuation of the chamber and/or the supply of a purge gas.

In Cases 1 to 3 described above, since the hydrazine compound gas is added on the basis of the ALD process using the same $NH_3$ gas as the conventional one as the nitriding gas, it is possible to strengthen the nitriding without greatly changing the conventional process conditions. Therefore, it is possible to form a nitride film having a good film quality at a lower temperature. In addition, since the base of the nitriding gas is the same $NH_3$ gas as the conventional one and the expensive hydrazine compound gas is additionally used, it is possible to suppress an increase in gas cost.

In Case 4 described above, since only the hydrazine compound gas having high nitriding power is used as the nitriding gas, it is possible to further lower the film forming temperature by the high nitriding power.

In addition, since the hydrazine compound gas has high reactivity, the purge before supplying the source gas and after supplying the hydrazine compound gas may be performed to such an extent that a CVD reaction can be suppressed as much as possible.

SPECIFIC EXAMPLE

Next, a specific example of forming a TiN film on a semiconductor wafer (hereinafter, simply referred to as a "wafer") which is a substrate by a sequence based on ALD using $TiCl_4$ as a source gas will be described.

[Film Forming Apparatus]

Figure 1:
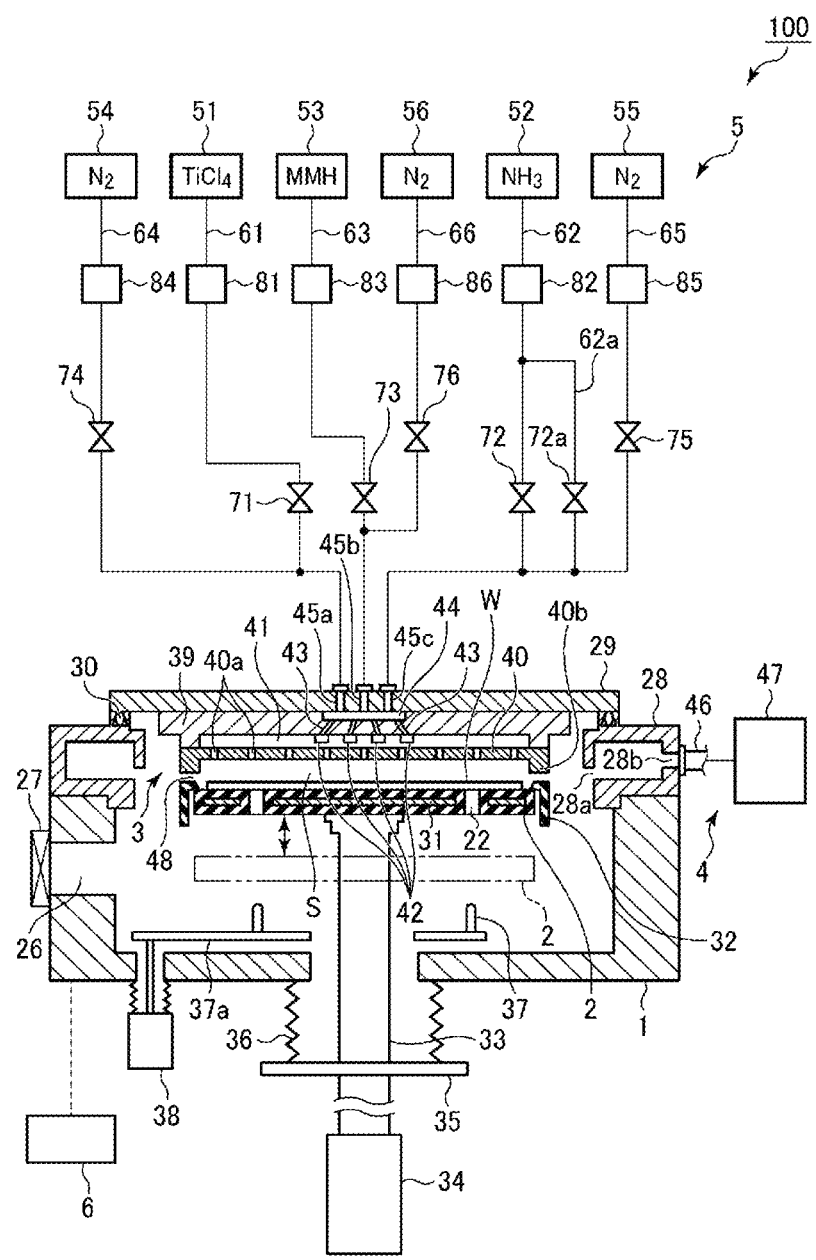
FIG. 1 is a cross-sectional view illustrating an example of a film forming apparatus for performing a film forming method according to an embodiment.

FIG. 1 is a cross-sectional view illustrating an example of a film forming apparatus for performing a film forming method according to an embodiment. A film forming apparatus 100 includes a chamber 1, a susceptor 2, a shower head 3, an exhaust part 4, a gas supply mechanism 5, and a controller 6.

The chamber 1 is made of a substantially cylindrical metal, and may have a volume of about 0.5 to 2 L. A loading/unloading port 26 for loading/unloading a wafer W into/from a vacuum transport chamber (not illustrated) by a transport mechanism (not illustrated) is formed in the side wall of the chamber 1, and the loading/unloading port 26 is configured to be capable of being opened/closed by a gate valve 27.

An annular exhaust duct 28 having a rectangular cross section is provided on the main body of the chamber 1. A slit 28a is formed in the exhaust duct 28 along the inner peripheral surface. In addition, an exhaust port 28b is formed in the outer wall of the exhaust duct 28. On the upper side of the exhaust duct 28, a ceiling wall 29 is provided so as to close the upper opening of the chamber 1. The space between the ceiling wall 29 and the exhaust duct 28 is hermetically sealed with a seal ring 30.

The susceptor 2 is configured to place thereon a wafer W which is a substrate in the chamber 1, has a disk shape having a size corresponding to the wafer W, and is horizontally provided. The susceptor 2 is supported on a support member 33. A heater 31 for heating the wafer W is embedded in the susceptor 2. The heater 31 is adapted to generate heat by being supplied with power from a heater power supply (not illustrated). Then, by controlling the output of the heater 31, the wafer W is controlled to a predetermined temperature. The susceptor 2 is provided with a ceramic cover member 32 so as to cover the outer peripheral area and the side surface of the wafer placement surface.

The support member 33 for supporting the susceptor 2 extends from the center of the bottom surface of the susceptor 2 through a hole formed in the bottom wall of the chamber 1 to the lower side of the chamber 1 and the lower end thereof is connected to the lifting mechanism 34. The susceptor 2 is adapted to be capable of ascending and descending between a processing position illustrated in FIG. 1 and a transport position indicated by a one-dot chain line below the processing portion by the lifting mechanism 34 through the support member 33. At the transport position, the wafer is capable of being transported. In addition, a flange unit 35 is attached to the support member 33 below the chamber 1, and a bellows 36, which partitions the atmosphere in the chamber 1 from the external air, is provided between the bottom surface of the chamber 1 and the flange unit 35 to expand and contract in response to the ascending/descending movement of the susceptor 2.

Three wafer support pins 37 (only two wafer pins are illustrated) are provided in the vicinity of the bottom surface of the chamber 1 so as to protrude upward from a lifting plate 37a. The wafer support pins 37 are configured to be capable of ascending/descending via the lifting plate 37a by the lifting mechanism 38 provided below the processing container 1, and are inserted into through holes 22 provided in the susceptor 2 located at the transport position so as to be capable of protruding or retracting with respect to the upper surface of the susceptor 2. Thus, the wafer W is delivered between the wafer transport mechanism (not illustrated) and the susceptor 2.

The shower head 3 is configured to supply a processing gas into the chamber 1 in the form of shower, and is provided in the upper portion of the chamber 1 to face the susceptor 2 and has substantially the same diameter as the susceptor 2. The shower head 3 has a main body 39 fixed to the ceiling wall 29 of the chamber 1 and a shower plate 40 connected to the lower side of the main body 39. A gas diffusion space 41 is formed between the main body 39 and the shower plate 40.

In the gas diffusion space 41, a plurality of gas diffusion members 42 are provided. A plurality of gas discharge holes are formed around the gas diffusion members 42. Each of the gas dispersion members 42 is connected to one end of each of a plurality of gas supply paths 43 provided in the main body 39. The other end of each of the gas supply paths 43 is connected to a diffusion portion 44 formed in the central portion of the upper surface of the main body 39. Further, in the central portion of the main body 39, three gas inlet holes 45a, 45b, 45c penetrating from the upper surface of the main body 39 to the diffusion portion 44 are provided.

An annular protrusion 40b protruding downward is formed at the peripheral edge of the shower plate 40, and gas ejection holes 40a are formed in the flat surface inside the annular protrusion 40b of the shower plate 40. In the state where the susceptor 2 is located at the processing position, a processing space S is formed between the shower plate 40 and the susceptor 22, and the annular protrusion 40b and the upper surface of the cover member 32 of the susceptor 2 are located close to each other so as to form an annular gap 48.

An exhauster 4 includes an exhaust pipe 46 connected to the exhaust port 28b of the exhaust duct 28, and an exhaust mechanism 47 connected to the exhaust pipe 46 and including, for example, a vacuum pump and a pressure control valve. In a processing, the gas in the chamber 1 reaches the exhaust duct 28 via the slit 28a, and is exhausted from the exhaust duct 28 through the exhaust pipe 46 by the exhaust mechanism 47 of the exhauster 4.

The processing gas supply mechanism 5 includes a $TiCl_4$ gas supply source 51, an $NH_3$ gas supply source 52, an MMH gas supply source 53, a first $N_2$ gas supply source 54, a second $N_2$ gas supply source 55, and a third $N_2$ gas supply source 56. The $TiCl_4$ gas supply source 51 supplies $TiCl_4$ gas which is a Ti source gas. The $NH_3$ gas supply source 52 supplies $NH_3$ gas which is a nitriding gas. The MMH gas supply source 53 supplies an MMH gas as a hydrazine compound gas which is a nitriding gas. The first to third $N_2$ gas sources 54, 55, 56 supply $N_2$ gas as a carrier gas and a purge gas. In addition, the carrier gas and the purge gas are not limited to $N_2$ gas, and other inert gases such as, for example, Ar gas, may be used.

One end of a $TiCl_4$ gas supply pipe 61 is connected to the $TiCl_4$ gas supply source 51. One end of an $NH_3$ gas supply pipe 62 is connected to the $NH_3$ gas supply source 52. One end of an MMH supply pipe 63 is connected to the MMH gas supply source 53. To one of the first $N_2$ gas supply source 54, the second $N_2$ gas supply source 55, and the third $N_2$ gas supply source 56, one end of each of the first $N_2$ gas supply pipe 64, the second $N_2$ gas supply pipe 65, and the third $N_2$ gas supply pipe 66 is connected. The other end of the $TiCl_4$ gas supply pipe 61 is connected to the gas inlet hole 45a, the other end of the $NH_3$ gas supply pipe 62 is connected to the gas inlet hole 45c, and the other end of the MMH gas supply pipe 63 is connected to the gas inlet hole 45b. The other end of the first $N_2$ gas supply pipe 64 is connected to the $TiCl_4$ gas supply pipe 61, the other end of the second $N_2$ gas supply pipe 65 is connected to the $NH_3$ supply pipe 62, and the other end of the third $N_2$ gas supply pipe 66 is connected to the MMS gas supply pipe 63. A branch pipe 62a branches off in the middle of the $NH_3$ gas supply pipe 62, and the other end of the branch pipe 62a joins the $NH_3$ gas supply pipe 62 via the second $N_2$ gas supply pipe 65. By providing the branch pipe 62a in this manner, it is possible to supply a large flow rate of $NH_3$ gas. The $TiCl_4$ gas supply pipe 61, the $NH_3$ gas supply pipe 62, the branch pipe 62a, and the MMH gas supply pipe 63 are provided with opening/closing valves 71, 72, 72a, 73 at the upstream sides of the joining portions of the $N_2$ gas supply pipes, respectively. In addition, the first $N_2$ gas supply pipe 64, the second $N_2$ gas supply pipe 65, and the third $N_2$ gas pipe 66 are provided with opening/closing valves 74, 75, 76, respectively. In addition, the $TiCl_4$ gas supply pipe 61, the $NH_3$ gas supply pipe 62, the MMH gas supply pipe 63, the first $N_2$ gas supply pipe 64, the second $N_2$ gas supply pipe 65, and third $N_2$ gas pipe 66 are provided with flow rate controllers at the upstream sides of the flow rate controllers 81 to 86, respectively. For example, mass flow controllers may be used as the flow rate controllers.

Then, in the state where $N_2$ gas is constantly supplied by making the $N_2$ the opening/closing valves 74, 75, 76 of the first $N_2$ gas supply pipe 64, the second $N_2$ gas supply pipe 65, and the third $N_2$ gas supply pipe 66 always open, predetermined film formation may be performed by operating the valves 71, 72, 73.

The flow rate of $N_2$ gas may be increased during the purge process by providing pipes, which branch from the first $N_2$ gas supply pipe 64, the second $N_2$ gas supply pipe 65, and the third $N_2$ gas supply pipe 66, respectively. In addition, the purge gas is not limited to $N_2$ gas, and may be another inert gas such as, for example, Ar gas.

As a Ti source gas, in addition to $TiCl_4$, for example, tetra(isopropoxy) titanium (TTIP), titanium tetrabromide ($TiBr_4$), titanium tetraiodide ($TiI_4$), tetrakis ethylmethylamino titanium (TEMAT), tetrakis dimethylamino titanium (TDMAT), or tetrakis diethylamino titanium (TDEAT) may also be used.

The controller 6 is constituted with a computer, and includes a main controller having a CPU, an input device (e.g., a keyboard or a mouse), an output device (e.g., a printer), a display device (e.g., a display), and a storage device (a storage medium). For example, the main controller controls the operations of respective components such as, for example, opening/closing of the opening/closing valves 71 to 76, adjustment of a gas flow rate through the flow rate controllers 81 to 86, adjustment of the pressure in the chamber 1 by a pressure control valve, and adjustment of the temperature of the wafer W by the heater 31. The control of these operations is executed by a processing recipe which is a control program stored in a storage medium (e.g., a hard disk, an optical desk, or a semiconductor memory) embedded in the storage device.

[Film Forming Method]

Next, a method of forming a TiN film in the film forming apparatus 100 configured as described above will be described.

First, the gate valve 27 is opened, and a wafer W is loaded into the chamber 1 from the vacuum transport chamber by the transport device and placed on the susceptor 2. After retracting the transport device, the gate valve 27 is closed and the susceptor 2 is raised to the processing position. Subsequently, $N_2$ gas is continuously supplied into the processing space S from the first $N_2$ gas supply source 54, the second $N_2$ gas supply source 55, and the third $N_2$ gas supply source 56 so as to maintain the inside of the chamber 1 at a predetermined decompressed state, and the temperature of the susceptor 2 is controlled to a predetermined temperature by the heater 31.

Then, while maintaining the state where $N_2$ gas is continuously supplied, the opening/closing valves 71, 72, 73 of the $TiCl_4$ gas supply pipe 61, the $NH_3$ gas supply pipe 62, and the MMH gas supply pipe 63 are operated in order to form a TiN film. The film formation at this time is performed in a sequence based on ALD in which $TiCl_4$ gas and a nitriding gas are sequentially supplied. For example, the film formation may be performed according to any of the sequences of Cases A to D below. Cases A to D correspond to Sequences 1 to 4 described above, respectively.

1. Case A

In Case A, the opening/closing valves 74, 75, 76 are opened, and a film forming process is performed in the sequence as illustrated in the timing chart of FIG. 2 in the state in which $N_2$ gas as a carrier gas and a purge gas is made to continuously flow. In the initial state, the opening/closing valves 71 to 73 are closed. From this state, first, the opening/closing valve 71 is opened so as to supply $TiCl_4$ gas to the processing space S (step S1). Thus, the $TiCl_4$ gas is adsorbed on the surface of the wafer W. Next, the opening/closing valve 71 is closed, and only the $N_2$ gas is supplied to the processing space S so as to perform purge for removing the residual gas on the wafer W (step S2). Next, the opening/closing valve 72 is opened so as to supply $NH_3$ gas, which is a nitriding gas, to the processing space S (step S3). As a result, the $TiCl_4$ gas adsorbed on the surface of the wafer W reacts with the $NH_3$ gas to form a thin unit TiN film. Next, the opening/closing valve 72 is closed, and only the $N_2$ gas is supplied to the processing space S so as to perform purge for removing the residual gas on the wafer W (step S4). After repeating steps S1 to S4 described above in a predetermined cycle, the opening/closing valve 73 is opened so as to perform a post flow of an MMH gas (step S5). Thus, a TiN film of a predetermined thickness is formed. In Case A, the raw material adsorption process is configured with steps S1 and S2, and the nitriding process is configured with steps S3 and S4.

In Case A, the wafer temperature (susceptor temperature) may be in the range of 200 to 450° C. The temperature may be in the range of 300 to 400° C., for example, 350° C. In addition, the pressure in the chamber 1 may be in the range of 1 to 10 Torr (133 to 1333 Pa), and may be set to, for example, 3 Torr (400 Pa).

When the chamber volume is in the range of 0.5 to 2 L in the film forming apparatus illustrated in FIG. 1, the following conditions may be used. In step S1 of supplying $TiCl_4$ gas, the gas flow rate may be in the range of 200 to 300 sccm, and the time may be in the range of 0.03 to 0.07 sec. In step S2 of performing purge, the flow rate of $N_2$ gas may be in the range of 1500 to 2500 sccm, and the time may be in the range of 0.2 to 0.4 sec. In step S3 of supplying $NH_4$ gas, the gas flow rate may be in the range of 5500 to 6500 sccm, and the time may be in the range of 0.3 to 0.7 sec. In step S4 of performing purge, the gas flow rate may be in the range of 1500 to 2500 sccm, and the time may be in the range of 0.2 to 0.4 sec.

The conditions of steps S1 to S4 may be set appropriately to approach pure ALD. When a CVD reaction occurs, the film deposition rate (cycle rate) per cycle increases. However, since the step coverage decreases, the cycle rate may be set to a value close to that of pure ALD, and may be in the range of 0.3 to 0.6 nm/cycle. Under the above conditions, it is possible to suppress the CVD reaction as much as possible so as to perform well-controlled ALD film formation.

In Case A, the most important one is step S5. In step S5, an insufficiently nitrided portion of the TiN film formed through the ALD using $TiCl_4$ gas and $NH_3$ gas is further nitrided with the MMH gas which is a hydrazine compound gas. At this time, the gas flow rate in step S5 may be in the range of 100 to 400 sccm. In addition, the time of step S5 may be 10 sec or more, may be 30 sec or more, and may be 60 sec or more. However, when the time is too long, the effect is saturated and the throughput is lowered. Thus, the time may be 80 sec or shorter.

In Case A, it is possible to make nitriding of the film further progress by performing the post flow of the MMH gas after forming a TiN film of a predetermined film thickness through ALD using $TiCl_4$ gas and $NH_3$ gas. For this reason, it is possible to remove chlorine contained as an impurity in the film, and thus it is possible to form a TiN film having a good film quality even at a low temperature.

When forming a TiN film through ALD using $TiCl_4$ gas and $NH_3$ gas, a temperature of 430° C. or higher is required to maintain the film quality. However, in Case A, it is possible to lower the temperature by 30° C. or higher.

2. Case B

In Case B, the opening/closing valves 74, 75, 76 are opened, and a film forming process is performed as illustrated in the timing chart of FIG. 3 in the state in which $N_2$ gas as a carrier gas and a purge gas is made to continuously flow. In Case B, after steps S1 to S4 are repeated a predetermined number of times as in Case A, the sequence for performing the post flow in step S5 is regarded as one set, and this set is repeated two or more predetermined times with purge interposed between each two successive sets, thereby forming a TiN film of a predetermined thickness. The purge time at this time may be in the range of 0.1 to 10 sec.

In Case B, when forming a TiN film having a predetermined film thickness, the post flow of the MMH gas is performed plural times. Thus, the effect of removing chlorine contained as an impurity in the film is higher than that in Case A where the post flow is performed only after film formation.

In addition, the conditions in steps S1 to S5 in Case B are the same as those in Case A.

3. Case C

In Case C, the opening/closing valves 74, 75, 76 are opened, and a film forming process is performed in the sequence as illustrated in the timing chart of FIG. 4 in the state in which $N_2$ gas as a carrier gas and a purge gas is made to continuously flow. In the initial state, the opening/closing valves 71 to 73 are closed. From this state, first, the opening/closing valve 71 is opened so as to supply $TiCl_4$ gas to the processing space S (step S11). Thus, the $TiCl_4$ gas is adsorbed on the surface of the wafer W. Next, the opening/closing valve 71 is closed, and only the $N_2$ gas is supplied to the processing space S so as to perform purge for removing the residual gas on the wafer W (step S12). Next, the opening/closing valve 72 is opened so as to supply $NH_3$ gas, which is a nitriding gas, to the processing space S (step S13). As a result, the $TiCl_4$ gas adsorbed on the surface of the wafer W reacts with the $NH_3$ gas to form a thin unit TiN film. Next, the opening/closing valve 72 is closed, and only the $N_2$ gas is supplied to the processing space S so as to perform purge for removing the residual gas on the wafer W (step S14). Next, the opening/closing valve 73 is opened so as to supply an MMH gas, which is a nitriding gas, to the processing space S (step S15). By the highly reactive MMH gas, it is possible to make the nitriding reaction further progress after the nitriding with the $NH_3$ gas in step S13. Next, the opening/closing valve 73 is closed, and only the $N_2$ gas is supplied to the processing space S so as to perform purge for removing the residual gas on the wafer W (step S16). By repeating steps S11 to S16 described above in a predetermined cycle, a TiN film having a predetermined film thickness is formed. In Case C, the raw material adsorption process is configured with steps S11 and S12, and the nitriding process is configured with steps S13 to S16.

In case C, the wafer temperature (susceptor temperature) may be in the range of 200 to 450° C., and may be in the range of 400° C. or less. In Case C, the effect of lowering the film forming temperature is higher, and the film forming temperature may be in the range of 200 to 300° C. For example, it is possible to obtain a film having better quality at 250° C.

When the chamber volume is in the range of 0.5 to 2 L in the film forming apparatus illustrated in FIG. 1, the following conditions may be used. Step S11 of supplying $TiCl_4$ gas, step S12 of performing subsequent purge, step S13 of supplying $NH_3$ gas, and step S14 of performing subsequent purge may be the same conditions as steps S1 to S4 of Case A.

In the step S15 of supplying the MMH gas, the time may be in the range of 0.01 to 0.05 sec, and the flow rate may be in the range of 5 to 300 sccm. Since the MMH gas is highly reactive, the cycle rate is saturated in a short time, and the flow rate may be small.

In particular, when the film forming temperature is 300° C. or higher, for example, 350° C., the time for step S15 may be short in the range of 0.01 to 0.05 sec (e.g., 0.03 sec), and the gas flow rate may be small in the range of 5 to 300 sccm (e.g., 30 sccm) in order to enable the ALD reaction. The MMH decomposes at 300° C. or higher. Thus, in the case where the film forming temperature is 300° C. or higher, when the time and flow rate in step S15 exceed the above-mentioned ranges, the amount of carbon (C) in the film may increase.

Meanwhile, when the film forming temperature is less than 300° C. (e.g., 250° C.), the reactivity of the MMH gas decreases. The time in step S15 may be longer and the gas flow rate be larger. The time may be in the range of 0.1 to 1.0 sec, and the flow rate may be in the range of 20 to 200 sccm.

Step S16 of performing purge after supplying the MMH gas is a particularly important step. A hydrazine compound gas such as the MMH gas has high reactivity. Thus, when the hydrazine compound gas remains even a little, it easily reacts with $TiCl_4$ gas which is the source gas to be supplied next, and thus a film formation mode by CVD appears and the step coverage may be aggravated. For this reason, the time of step S16 may be set to a time in which a CVD reaction does not substantially occur between the remaining MMH gas and the $TiCl_4$ gas to be supplied next. Specifically, the time of step S5 may be 1.5 sec or more, may be 2.5 sec or more, and may be 4 sec or more. However, when the length is too long, the throughput is lowered, and thus the time may be 10 sec or shorter.

In Case C described above, in the film formation through ALD in which the adsorption process of $TiCl_4$ gas which is the source gas and the nitriding process with a nitriding gas are repeated, nitriding with an MMH gas having high reactivity is performed during the nitriding process and after the nitriding with the $NH_3$ gas. Therefore, it is possible to strengthen the nitriding reaction of the film, and thus it is possible to greatly lower the film forming temperature required for forming a TiN film having a good film quality.

As described above, when forming a TiN film through ALD using $TiCl_4$ gas and $NH_3$ gas, a temperature of 430° C. or higher is required to maintain the film quality. However, in Case C, it is possible to lower the temperature by 100° C. or higher.

4. Case D

In Case D, the opening/closing valves 74, 75, 76 are opened, and a film forming process is performed in the sequence as illustrated in the timing chart of FIG. 5 in the state in which $N_2$ gas as a carrier gas and a purge gas is made to continuously flow. In the initial state, the opening/closing valves 71 to 73 are closed. From this state, first, the opening/closing valve 71 is opened so as to supply $TiCl_4$ gas to the processing space S (step S21). Thus, the $TiCl_4$ gas is adsorbed on the surface of the wafer W. Next, the opening/closing valve 71 is closed, and only the $N_2$ gas is supplied to the processing space S so as to perform purge for removing the residual gas on the wafer W (step S22). Next, the opening/closing valve 73 is opened so as to supply an MMH gas, which is a nitriding gas, to the processing space S (step S23). As a result, the $TiCl_4$ gas adsorbed on the surface of the wafer W reacts with the MMH gas to form a thin unit TiN film. Next, the opening/closing valve 73 is closed, and only the $N_2$ gas is supplied to the processing space S so as to perform purge for removing the residual gas on the wafer W (step S24). In Case D, the raw material adsorption process is configured with steps S21 and S22, and the nitriding process is configured with steps S23 and S24.

In Case D, the wafer temperature (susceptor temperature) may be in the range of 200 to 450° C., and may be 350° C. or lower. In Case D, the effect of lowering the film forming temperature is higher than that in Case C, and the film forming temperature may be in the range of 200 to 300° C.

When the chamber volume is in the range of 0.5 to 2 L in the film forming apparatus illustrated in FIG. 1, the following conditions may be used. Step S21 of supplying $TiCl_4$ gas and step S22 of performing subsequent purge may be the same conditions as steps S1 and S2 of Case A.

In step S23 of supplying the MMH gas, since the MMH gas is highly reactive, the cycle rate is saturated in a short time, and the flow rate of the MMH gas may be small. However, unlike Case C, since the nitriding with the $NH_3$ gas is not performed, the conditions are different from those in Case C. In consideration of that point, the time of step S23 may be in the range of 0.05 to 1.0 sec, and the flow rate may be in the range of 5 to 300 sccm.

Step S24 of performing purge after supplying the MMH gas is a particularly important process as in the case of Case C. A hydrazine compound gas such as the MMH gas has high reactivity. Thus, when the hydrazine compound gas remains even a little, it easily reacts with $TiCl_4$ gas which is the source gas to be supplied next, and thus a film formation mode by CVD appears and the step coverage may be aggravated. For this reason, the time of step S24 may be set to a time in which a CVD reaction does not substantially occur between the remaining MMH gas and the TiCl$_4$ gas to be supplied next. Unlike Case C, since the nitriding with the NH$_3$ gas is not performed in Case D, the conditions in Case D are different from those in Case C. In consideration of that point, the time of step S24 may be in the range of 3 sec or longer, and may be in the range of 5 sec or longer. However, when the length is too long, the throughput is lowered, and thus the time may be 20 sec or shorter.

In Case D described above, in the film formation through ALD in which the adsorption process of TiCl$_4$ gas which is the source gas and the nitriding process with a nitriding gas are repeated, in the nitriding process, nitriding with an MMH gas, which is a hydrazine compound gas having high reactivity is performed. Therefore, the nitriding reaction of the film easily proceeds, and thus it is possible to greatly lower the film forming temperature required for forming a TiN film having a good film quality.

As described above, when forming a TiN film through ALD using TiCl$_4$ gas and NH$_3$ gas, a temperature of 430° C. or higher is required to maintain the film quality. However, in Case D, it is possible to lower the temperature by 100° C. or higher.

<Mechanism of Film Quality Improvement by Lowering of Film Forming Temperature>

Next, the mechanism of film quality improvement by lowering of a film forming temperature according to an embodiment will be described by taking a case of forming a TiN film as an example.

In the conventional formation of a TiN film through ALD using TiCl$_4$ gas and NH$_3$ gas, since the reactivity between TiCl$_4$ and NH$_3$ gas is not so high, when the film forming temperature is lowered to 400° C. or lower, TiCl$_4$ is not nitrided, a large amount of chlorine remains, and thus the generation of TiN becomes incomplete. In particular, when the film forming temperature is 300° C. or lower, TiCl$_3$ remains in the film without being nitrided, forming a discontinuous film. Conventionally, film formation has been performed at the temperature of about 430° C. in order to sufficiently promote the nitriding reaction. That is, by setting the film forming temperature to about 430° C., chlorine is sufficiently removed to form a continuous TiN film, and a resistivity is also lowered.

However, it is impossible to greatly improve the reaction only with the reaction of TiCl$_4$ gas and NH$_3$ gas, which makes it difficult to lower the film forming temperature. In addition, when the film forming temperature is high, crystal growth proceeds, the surface roughness is increased, and problems such as, for example, deterioration in resistivity due to crystal grain boundaries also occur.

On the contrary, it is possible to enhance the reactivity of the nitriding reaction of TiCl$_4$ by using an MMH gas which is a hydrazine compound gas for a part or all of the nitriding gas. For example, in the sequence of Case C, it is possible to cause the chlorine in the film to be sufficiently removed even at a low temperature of 300° C. or lower. Therefore, it is possible to obtain a continuous TiN film from which chlorine is sufficiently removed even at a low film forming temperature. That is, it is possible to lower the film forming temperature and to lower the resistivity of the film. In addition, since it is possible to reduce the crystal grain size from the fact that film formation is enabled at a low temperature in this way, it is possible to obtain a TiN film with a small surface roughness and a good specific resistivity characteristic.

TEST EXAMPLE

Subsequently, test examples will be described.

Test Example 1

First, test results from which the effect of the post flow of an MMH gas has been confirmed will be described. Here, a film forming apparatus having a chamber volume of 1,520 mL and having the configuration illustrated in FIG. 1 was used. The film forming temperature (wafer temperature) was changed in the range of 350 to 430° C., the pressure was set to 3 Torr (400 Pa), and the times of steps S1, S2, S3, and S4 were set to 0.05 sec, 0.2 sec, 0.5 sec, and 0 sec, respectively. Regarding flow rates, the flow rate of TiCl$_4$ gas was set to 240 sccm, the flow rate of NH$_3$ gas was set to 5,700 sccm, and the gas flow rate in each of the first to third N$_2$ gas supply pipes was set to 2 slm (6 slm in total). In the post flow of the MMH gas in step S5, the flow rate of the MMH gas was set to 300 sccm, and the time was set in the range of 0 to 60 sec. In addition, the target film thickness was set to 5.5 nm (55 Å) (number of cycles: 133 times (wafer temperature: 430° C.) and 160 times (wafer temperature: 350° C.)). In addition, the gap between the susceptor and the shower head was set to 3 mm.

FIGS. 6 and 7 are diagrams representing the influence of the post flow on the resistivity of the film, in which FIG. 6 illustrates the case in which the film forming temperature was 350° C. and FIG. 7 illustrates the case in which the film forming temperature was 430° C. In FIGS. 6 and 7, the case where the post-flow of NH$_3$ gas was performed for 60 seconds is plotted for comparison.

As illustrated in these drawings, it was confirmed that the resistivity is greatly reduced by performing the post flow of the MMH gas compared to the reference where no post flow was performed. In addition, it was confirmed that the effect of reducing resistivity is further high even when the post flow time is 10 seconds, and is further improved as the post flow time increases to 30 sec and to 60 sec. As represented in FIG. 6, at a lower temperature of 350° C., the resistivity has a value of 1700 μΩ·cm, which is a very large value as the reference, while, when the post flow time is 60 sec, the resistivity is about 1000 μΩ·cm. Thus, it has been confirmed that the resistivity is reduced by 38%. In addition, as represented in FIG. 7, even at 430° C., it has been confirmed that the resistivity is reduced by 20% with respect to the reference when the post flow time is 60 sec. Meanwhile, with the post flow of NH$_3$ gas, the resistivity is hardly reduced.

FIG. 8 is a diagram representing a relationship between a wafer temperature (susceptor temperature) and a resistivity in the case of reference (post flow absence) and in the case where the post flow time of an MMH gas is 60 sec. As represented in this figure, it has been confirmed that by performing the post flow for 60 sec, a resistivity equivalent to that of the reference is obtained at a temperature about 30° C. or lower. That is, it has been confirmed that it is possible to lower the film forming temperature by about 30° C.

FIG. 9 is a diagram representing a relationship between a post flow time and a Cl2p/Ti2p area ratio by XPS, which is an index of a Cl concentration in a film. As represented in this figure, it has been confirmed that the chlorine concentration in the film is lowered by performing the post flow with the MMH gas. This tendency is consistent with the case of the resistivity, and it has been found that the resistivity decreased due to the decrease of the chlorine concentration.

Test Example 2

Next, the conditions and effects at the time of film formation in Case C above were confirmed. Here, as in Test Example 1, a film forming apparatus having a chamber volume of 1,520 mL and having the configuration illustrated in FIG. 1 was used. The film forming temperature (wafer temperature) was set in the range of 250 to 350° C., and the pressure was set to 3 Torr (400 Pa). In addition, the reference conditions of the time of each step and the flow rate were made as follows, and the predetermined conditions were changed as necessary.

The times of steps S11, S12, S13, S14, S15, and S16: 0.05 sec, 0.20 sec, 0.50 sec, 0.30 sec, 0.03 sec, and 0.50 sec, respectively.

Gas flow rate: the flow rate of $TiCl_4$ gas=240 sccm (4.2 cc/cycle), the flow rate of $NH_3$ gas=5,700 sccm (99.8 cc/cycle), the flow rate of the MMH gas=30 sccm (0.79 cc/cycle), gas flow rates of in each of the first to third $N_2$ gas supply pipes=2 slm (6 slm in total).

(1) Test Example 2-1

First, tests were performed on the MMH gas supply time and flow rate in step S15. Here, film formation was performed in the state of setting the wafer temperature (susceptor temperature) to 350° C. while changing the MMH gas supply time and flow rate under the above-described reference conditions and using the reference conditions for the other conditions.

FIG. 10 is a diagram representing a relationship between an MMH gas supply time and a cycle rate at each flow rate when the flow rate and the supply time of the MMH gas are changed in step S15. The case where no MMH gas was supplied is also plotted for comparison. As represented in this figure, the cycle rate is saturated within an extremely short time of 0.03 sec. That is, it has been confirmed that ALD can be sufficiently performed when the MMH gas supply time in step S15 is a short time of 0.03 sec.

FIG. 11 is a diagram representing a relationship between a thickness and a resistivity of a TiN film when the flow rate and the supply time of the MMH gas in step S15 were changed. The case where no MMH gas was supplied is also plotted for comparison. FIG. 11 represents that the resistivity value of a TiN film is reduced as the supply time is shorter at each flow rate of the MMH gas.

(2) Test Example 2-2

Next, tests were performed on the purge after supplying the MMH gas in step S16 in Case C above. Here, the tests were performed in the state where the wafer temperature (susceptor temperature) was set to 350° C. while changing the flow rate and the purge time of the MMH gas under the above-described reference conditions.

FIG. 12 is a diagram representing a relationship between a purge time and a cycle rate of an MMH gas at each flow rate of the MMH gas. As represented in this figure, it can be seen that the cycle rate tends to decrease as the purge time after supplying the MMH gas increases, and thus approaches pure ALD by prolonging the purge time.

FIG. 13 is a diagram representing a relationship between a thickness and a resistivity of a TiN film when the purge time of the MMH gas is changed by changing the flow rate of the MMH gas. The case where no MMH gas was supplied is also plotted for comparison. As represented in this figure, it can be seen that as the purge time is prolonged, the film thickness of the TiN film is reduced and approaches pure ALD. In addition, since the increase in the resistivity due to the use of the MMH gas is not seen, it can be understood that the smaller the flow rate of the MMH gas, the lower the resistivity value.

(3) Test Example 2-3

Next, a resistivity, which was obtained by performing film formation while changing the temperature under the above reference conditions (with the MMH gas), and a resistivity, which was obtained by performing film formation under the above reference conditions except that the supply of the MMH gas and the subsequent purge were not performed, were compared. The results are represented in FIG. 14. As represented in FIG. 14, it has been confirmed that the resistivity value in the case where the film formation was performed with the MMH gas tends to be lowered than that in the case where the film formation was performed in the absence of the MMH gas, and that the temperature at which the same resistivity value is obtained is lowered by about 100° C.

(4) Test Example 2-4

Next, a step coverage in the case where the film formation was performed under the above reference conditions (MMH gas presence) while changing the temperature and a step coverage in the case where the film formation was performed under the above reference conditions in the state where the wafer temperature (susceptor temperature) was set to 430° C. except that supply of the MMH gas and the subsequent purge were not performed have been observed. Here, after forming a hole having a diameter of 50 nm and a depth of 1.3 μm, a SiN film was formed in the hole to form a hole having a diameter of 20 nm and to bury the TiN film. In the case of "MMH gas of presence," the wafer temperatures were set to 350° C., 300° C., and 250° C., and in the case of "MMH gas absence," the film forming temperature was set to 430° C.

FIG. 15 illustrates cross-sectional TEM photographs at this time. In FIG. 15, each cross section is divided into five portions from the top to the depth of 0.65 μm (Top, Mid1, Mid2, Mid3, Mid4), and the step coverage (S/C) is represented by a film thickness ratio of Mid4/Top. The left side of each TEM image is transmitted light, and the right side is scattered light. As represented in FIG. 15, in the case "MMH gas presence," the step coverage increases as the film forming temperature decreases, and at 250° C., the step coverage becomes 85.7%, which is equivalent to that in the case of "MMH gas absence." In "MMH gas absence," a rough portion was present in the TiN film, but in "MMH gas presence," the TiN film was smooth.

(5) Test Example 2-5

Next, the purge time of the purge after supplying the MMH gas in step S16 was further reviewed.

Here, a TiN film was formed at a wafer temperature of 350° C. while changing the purge time after supplying the MMH gas in step S16 was changed between 1 and 2.5 sec among the above-mentioned reference conditions. FIG. 16 represents a relationship between a purge time and a cycle rate at that time, and FIG. 17 represents a relationship between a film thickness and a resistivity when purge was performed for those purge times. As represented in FIG. 16, it can be seen that even if the purge time in step 16 is longer than 1 sec, the cycle rate continues to decrease and approaches purer ALD. In addition, it can be seen that as the purge time is longer, the film thickness is thinner in the same cycle number, and the resistivity value hardly changes.

The step coverage (S/C) obtained when forming a film by changing the purge time and the wafer temperature of the purge after supplying the MMH gas in step S16 among the above-mentioned reference conditions has been observed. Here, as in FIG. 15, after forming a hole having a diameter of 50 nm and a depth of 1.3 μm, a SiN film was formed in the hole to form a hole having a diameter of 20 nm and to bury the TiN film. The film forming temperature was set to 350° C., and the purge time in step S16 was changed to 0.57 sec, 1.5 sec, and 2.5 sec. In addition, the film was formed even at 300° C. for the condition that the purge time was set to 2.5 sec.

FIG. 18 is a cross-sectional TEM photograph at this time. In FIG. 18, as in FIG. 15, the TEM photograph is divided into five portions from the top to the depth of 0.65 μm (Top, Mid1, Mid2, Mid3, Mid4), and the step coverage (S/C) is represented by a film thickness ratio of Mid4/Top. For comparison, FIG. 18 also represents the case where the film forming temperature was set to 430° C. in "MMH gas absence" described above. In addition, in FIG. 18, as in FIG. 15, the left side of each TEM image is transmitted light and the right side is scattered light. As represented in FIG. 18, when the film forming temperature is 350° C., the step coverage increased as the purge time after supplying the MMH gas increased, and when the purge time was 2.5 seconds, the step coverage became 89.6%, which is better than that in "MMH gas absence." When the film forming temperature was lowered to 300° C. at the purge time of 2.5 sec, the step coverage was further improved to 97.9%. In addition, from the TEM photograph, it has been confirmed that the surface coverage of the middle portion was rough at the film forming temperature of 350° C. and at the purge time of 0.57 sec but at the film forming temperature of 300° C. and at the purge time of 2.5 sec, the film was smooth and had a small grain size.

(6) Test Example 2-6

Next, film forming tests were performed in the state where the wafer temperature was set to a further lower temperature of 250° C., and while changing the gas supply time and flow rate (exposure amount) of the MMH in step S15 and the purge time after supplying the MMH gas in step S16 among the above reference conditions. Here, with respect to each of a case (A) where the supply time and flow rate (exposure amount) of the MMH gas were set to 0.03 sec and 30 sccm (0.8 cc/cycle), respectively, a case (B) where the supply time and flow rate (exposure amount) of the MMH gas were set to 0.5 sec and 30 sccm (0.8 cc/cycle), respectively, and a case (C) where the supply time and flow rate (exposure amount) of the MMH gas were set to 0.5 sec and 90 sccm (2.4 cc/cycle), the purge time of the purge after supplying the MMH gas was changed to 1 sec, 2.5 sec, and 4 sec.

FIG. 19 represents a relationship between the thickness of the TiN film and the resistivity at that time. As represented in this figure, in the case of 250° C., it can be seen that the resistivity value decreases as the purge time of purge after supplying the MMH gas is prolonged, and saturating does not occur even at the purge time of 4 sec. In addition, FIG. 20 represents a relationship between the thickness of the TiN film and the resistivity when the purge time was fixed to 4 sec and the number of cycles was changed. As represented in this figure, in the case of 250° C., it has been confirmed that as the MMH gas is exposed more highly, the resistivity is lowered.

(7) Test Example 2-7

Next, tests were performed on the crystallinity of a film and the surface roughness of a film while changing the film forming temperature, in the case of using an MMH gas and in the case of not using an MMH gas.

First, the crystallinity of a TiN film in the case where film formation was performed while changing the temperature under the above reference conditions (with the MMH gas), and the crystallinity of a TiN film in the case where film formation was performed under the above reference conditions except that the supply of the MMH gas and the subsequent purge were not performed, were observed. XRD spectrums at that time are represented in FIG. 21. Here, in "MMH gas presence," spectrums obtained when film formation was performed at the temperatures of 250° C., 300° C., and 350° C., and thus films having the film thickness of about 100 A (10 nm) were formed are represented, and in "MMH gas absence," XRD spectrums obtained when film formation was performed at the temperatures of 250° C., 300° C., 350° C., and 430° C. and thus films having the film thickness of about 100 A (10 nm) are represented.

As represented in FIG. 21, in the film formed at 250° C. in "MMH gas absence," since a diffraction peak of $TiCl_3$ is observed, it can be seen that nitriding is insufficient. In contrast, in the film formed at 250° C. in "MMH gas presence", since the diffraction peak of $TiCl_3$ does not exist, it can be seen that nitriding has sufficiently progressed. It can be seen that the diffraction peak of TiN is hardly observed at 250° C., but becomes prominent at 300° C. or higher, and that the diffraction peak of TiN becomes higher as the temperature rises. FIG. 22 is a view representing a relationship between a wafer temperature (susceptor temperature) and a crystallite size obtained from the half-value width of TiN diffraction peak of the XRD spectrums. As represented in this figure, it can be seen that the crystallite size tends to increase as the temperature rises. Thus, while a TiN film having a small crystallite size is obtained at 250° C. in "MMH gas presence," a TiN film is not sufficiently formed in "MMH gas absence." That is, it has been confirmed that in "MMH gas presence," a TiN film having a crystallite size smaller than that in "MMH gas absence" is obtained.

Next, as described above, the surface roughness was observed on the films formed to have a film thickness of about 55 A (5.5 nm) while changing the temperature in "MMH gas presence" and "MMH gas absence." FIG. 23 is a diagram representing a relationship between a wafer temperature (susceptor temperature) and surface roughness RMS of a film. As represented in this figure, the surface roughness RMS tends to be smaller in "MMH gas presence" than in "MMH gas absence," and in "MMH gas presence," the RMS was 0.25 nm even at 250° C., which shows good surface roughness. In contrast, in "MMH gas presence," although the RMS was low as 0.29 nm at 430° C., the RMS was extremely high as 1.5 nm at 250° C. It is believed that this was resulted from the fact that, as illustrated in FIG. 23, in "MMH gas presence," nitriding proceeds even at 250° C., forming a continuous film having a small crystal size, but in "MMH gas absence," the reactivity is insufficient at 250° C., forming a discontinuous film. In the case of "MMH gas absence," a continuous film in which crystal grains are grown at 430° C. is formed.

FIG. 24 is a diagram representing an MMH gas supply time, a purge time, and the values of surface roughness (RMS) of films in each of the case where the MMH gas supply time was changed at the film forming temperature of 350° C. in Test Example 2-1 and the case where the purge time after supplying the MMH gas was changed at the film forming temperature of 350° C. in Test Example 2-2. As represented in this figure, it has been confirmed that the surface roughness becomes better as the MMH gas supply time is shorter and the purge time is longer.

For example, in the embodiments described above, the case where a TiN film is formed using $TiCl_4$ gas as a source gas has been described by way of an example, but, as described above, the present disclosure is not limited thereto. Various materials described above may be used as Ti sources, and various nitride films described above may be formed using other metal sources in addition to the Ti sources.

In addition, the film forming apparatus illustrated in FIG. 1 is merely an example. The film forming apparatus may be a sheet-type film forming apparatus having a structure different from that of FIG. 1, and may be a batch-type film forming apparatus that performs film formation on a plurality of substrates at once. In addition, the film forming apparatus may be a film forming apparatus that implements ALD through a relative movement between a gas supply area and a substrate. The film forming apparatus may be, for example, a semi-batch-type apparatus in which a plurality of substrates are placed on a rotatable stage and ALD film formation is implemented on the substrates by causing the substrates to pass through each gas supply area while rotating the stage. Furthermore, the film forming apparatus may be a semi-batch type film forming apparatus in which a plurality of substrates are placed on a non-rotating stage to perform ALD film formation.

The supply time and flow rate of the source gas, the nitriding gas, and the purge gas differ depending on, for example, the size of the chamber of the film forming apparatus, and may be set as appropriate depending on the size of the chamber.

In the embodiments described above, a semiconductor wafer is described as an example of a substrate, but the present disclosure is not limited to a semiconductor wafer, and may be another substrate such as, for example, a glass substrate used for a flat panel display (FPD) or a ceramic substrate.

According to the present disclosure, there are provided a film forming method and a film forming apparatus capable of forming a nitride film having a good film quality at a lower temperature using an ALD-based film forming method.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A film forming method to form a nitride film on a substrate, the method comprising:
repeatedly performing a source gas adsorption process including supplying a source gas containing a metal element on the substrate in a chamber and purging a residual gas, and a nitriding process including supplying a nitriding gas onto the substrate and purging a residual gas to form the nitride film on the substrate,
wherein a hydrazine-based compound gas is supplied as a part or all of the nitriding gas,
wherein the nitriding process includes supplying $NH_3$ gas as the nitriding gas; subsequent to supplying the $NH_3$ gas, purging a residual gas; subsequent to purging the residual gas, supplying a hydrazine-based compound gas as the nitriding gas; and, subsequent to supplying the hydrazine-based compound gas, purging a residual gas, and
wherein the nitride film formed by the film forming method with the source gas and the $NH_3$ gas contains impurities.

2. The film forming method of claim 1, wherein the nitride film is formed of any one of BN, AN, SiN, ScN, TiN, VN, CrN, MnN, FeN, CoN, NiN, CuN, ZnN, GaN, GeN, YN, ZrN, NbN, MoN, RuN, RhN, PdN, AgN, CdN, InN, SnN, HfN, TaN, WN, ReN, IrN, HgN, TN, and PbN.

3. The film forming method of claim 2, wherein the nitride film is a TiN film, and a substrate temperature during film formation ranges from 200° C. to 450° C.

4. The film forming method of claim 3, wherein, when a volume in the chamber is 0.5 L to 2.0 L, a supply amount in the supplying the hydrazine-based compound gas is 5 sccm to 300 sccm, and a supply time is 0.01 sec to 0.5 sec when the substrate temperature is 300° C. or higher and 0.03 sec to 1.0 sec when the substrate temperature is less than 300° C.

5. The film forming method of claim 4, wherein a time of the purging the residual gas after the supplying the hydrazine-based compound gas is 0.1 sec or longer.

6. The film forming method of claim 1, wherein the substrate temperature during the film formation ranges from 200° C. to 450° C.

7. The film forming method of claim 1, wherein the nitride film is a TiN film, and a substrate temperature during the film formation is 200° C. to 450° C.

8. The film forming method of claim 7, wherein, when a volume in the chamber is 0.5 L to 2.0 L, a supply amount of the supplying the hydrazine-based compound gas is 5 sccm to 300 sccm, and the supply time is 0.01 sec to 1.0 sec.

9. A film forming method to form a nitride film on a substrate, the method comprising:
a source gas adsorption process including supplying a source gas containing a metal element on the substrate in a chamber, and purging a residual gas;
a nitriding process including supplying $NH_3$ gas as a nitriding gas on the substrate and purging a residual gas; and
a process of supplying a hydrazine-based compound gas on the substrate,
wherein the process of supplying the hydrazine-based compound gas is performed after repeatedly performing the source gas adsorption process and the nitriding process a plurality of times,
wherein the nitriding process includes supplying $NH_3$ gas as the nitriding gas; subsequent to supplying the $NH_3$ gas, purging a residual gas; subsequent to purging the residual gas, supplying the hydrazine-based compound gas as the nitriding gas; and, subsequent to supplying the hydrazine-based compound gas, purging a residual gas, and wherein the nitride film formed by the film forming method with the source gas and the NH₃ gas contains impurities.

10. The film forming method of claim 9, wherein the nitride film is formed of any one of BN, AN, SiN, ScN, TiN, VN, CrN, MnN, FeN, CoN, NiN, CuN, ZnN, GaN, GeN, YN, ZrN, NbN, MoN, RuN, RhN, PdN, AgN, CdN, InN, SnN, HfN, TaN, WN, ReN, IrN, HgN, TiN, and PbN.

11. The film forming method of claim 9, wherein the nitride film is a TiN film, and a substrate temperature during film formation is 300° C. to 450° C.

12. The film forming method of claim 11, wherein, when a volume in the chamber is 0.5 L to 2.0 L, a supply amount of the supplying the hydrazine-based compound gas is 5 sccm to 300 sccm, and a supply time is 10 sec or longer.

13. The film forming method of claim 12, wherein the supply time in the process of supplying the hydrazine-based compound gas is 30 sec or longer.

14. The film forming method of claim 13, wherein a sequence of repeatedly performing the source gas adsorption process and the nitriding process a plurality of times and then performing the process of supplying the hydrazine-based compound gas is repeated two or more times with purging between sequences.

15. The film forming method of claim 13, wherein the source gas containing the metal element is TiCl4.

* * * * *